US010138385B2

(12) United States Patent
Matsumura et al.

(10) Patent No.: US 10,138,385 B2
(45) Date of Patent: Nov. 27, 2018

(54) CONDUCTIVE FILM FORMING COMPOSITION, CONDUCTIVE FILM, ORGANIC THIN FILM TRANSISTOR, ELECTRONIC PAPER, DISPLAY DEVICE, AND WIRING BOARD

(71) Applicant: FUJIFILM CORPORATION, Tokyo (JP)

(72) Inventors: Tokihiko Matsumura, Kanagawa (JP); Yasuaki Matsushita, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 0 days.

(21) Appl. No.: 15/450,246

(22) Filed: Mar. 6, 2017

(65) Prior Publication Data

US 2017/0174914 A1 Jun. 22, 2017

Related U.S. Application Data

(63) Continuation of application No. PCT/JP2015/077145, filed on Sep. 25, 2015.

(30) Foreign Application Priority Data

Sep. 30, 2014 (JP) ................................ 2014-201429

(51) Int. Cl.
*C09D 11/03* (2014.01)
*C09D 11/037* (2014.01)
(Continued)

(52) U.S. Cl.
CPC ................ *C09D 11/03* (2013.01); *C08K 5/13* (2013.01); *C09D 1/00* (2013.01); *C09D 5/24* (2013.01);
(Continued)

(58) Field of Classification Search
None
See application file for complete search history.

(56) References Cited

U.S. PATENT DOCUMENTS

2015/0191610 A1 7/2015 Matsushita et al.

FOREIGN PATENT DOCUMENTS

JP 2014-067677 A 4/2014

OTHER PUBLICATIONS

Notification of Transmittal of Translation of the International Preliminary Report on Patentability and Translation of Written Opinion of the International Searching Authority; PCT/JP2015/077145; dated Apr. 13, 2017.

(Continued)

*Primary Examiner* — Katie L Hammer
(74) *Attorney, Agent, or Firm* — Studebaker & Brackett PC

(57) ABSTRACT

The present invention provides a conductive film forming composition which makes it possible to prepare an organic thin film transistor having excellent insulation reliability while inhibiting the deterioration of mobility and has excellent coating properties and provides a conductive film and an organic thin film transistor which are prepared using the composition. The present invention also provides electronic paper and a display device which contain the organic thin film transistor and wiring board which has wiring formed using the conductive film forming composition. The conductive film forming composition according to the present invention contains water, conductive particles, and a migration inhibitor containing a compound having a group represented by Formula (1).

(Continued)

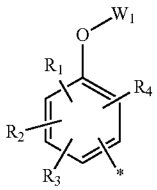

(1)

In Formula (1), $W_1$ represents any one of a hydrogen atom, Formula (A), Formula (B), and Formula (C). In Formula (1), $R_1$, $R_2$, $R_3$, and $R_4$ each independently represent any one of a hydrogen atom, a substituent, and $W_2$. $W_2$ represents Formula (D), Formula (E), or Formula (F). Here, in a case where $W_1$ is a hydrogen atom, at least one of $R_1$, $R_2$, $R_3$, or $R_4$ is $W_2$. In Formula (1), * represents a binding position.

18 Claims, 1 Drawing Sheet

(51) Int. Cl.

| | |
|---|---|
| ***C09D 11/52*** | (2014.01) |
| ***H01B 1/22*** | (2006.01) |
| ***H01L 27/28*** | (2006.01) |
| ***H01L 51/00*** | (2006.01) |
| ***H01L 51/10*** | (2006.01) |
| ***H05K 1/09*** | (2006.01) |
| ***C09D 7/40*** | (2018.01) |
| ***C08K 5/13*** | (2006.01) |
| ***C09D 1/00*** | (2006.01) |
| ***C09D 5/24*** | (2006.01) |
| ***H01L 21/28*** | (2006.01) |
| ***H01L 21/288*** | (2006.01) |
| ***H01L 29/786*** | (2006.01) |
| ***C09D 11/30*** | (2014.01) |
| ***C09D 7/63*** | (2018.01) |
| *C08K 3/28* | (2006.01) |
| *H01L 51/05* | (2006.01) |

(52) U.S. Cl.

CPC ................ *C09D 7/40* (2018.01); *C09D 7/63* (2018.01); *C09D 11/037* (2013.01); *C09D 11/30* (2013.01); *C09D 11/52* (2013.01); *H01B 1/22* (2013.01); *H01L 21/28* (2013.01); *H01L 21/288* (2013.01); *H01L 27/283* (2013.01); *H01L 29/786* (2013.01); *H01L 51/004* (2013.01); *H01L 51/005* (2013.01); *H01L 51/0021* (2013.01); *H01L 51/0073* (2013.01); *H01L 51/102* (2013.01); *H05K 1/09* (2013.01); *C08K 3/28* (2013.01); *C08K 2201/005* (2013.01); *H01L 51/0545* (2013.01); *H05K 1/097* (2013.01)

(56) References Cited

OTHER PUBLICATIONS

An Office Action; "Notification of Reasons for Refusal," issued by the Japanese Patent Office dated Nov. 21, 2017, which corresponds to Japanese Patent Application No. 2016-551984 and is related to U.S. Appl. No. 15/450,246; with English language translation.
International Search Report issued in PCT/JP2015/077145; dated Dec. 22, 2015.
Written Opinion issued in PCT/JP2015/077145 dated Dec. 22, 2015.

CONDUCTIVE FILM FORMING COMPOSITION, CONDUCTIVE FILM, ORGANIC THIN FILM TRANSISTOR, ELECTRONIC PAPER, DISPLAY DEVICE, AND WIRING BOARD

CROSS-REFERENCE TO RELATED APPLICATIONS

This application is a Continuation of PCT International Application No. PCT/JP2015/077145 filed on Sep. 25, 2015, which claims priority under 35 U.S.C. § 119(a) to Japanese Patent Application No. 2014-201429 filed on Sep. 30, 2014. The above application is hereby expressly incorporated by reference, in its entirety, into the present application.

BACKGROUND OF THE INVENTION

1. Field of the Invention

The present invention relates to a conductive film forming composition, a conductive film, an organic thin film transistor, electronic paper, a display device, and a wiring board.

2. Description of the Related Art

Organic thin film transistors are adopted in various electronic instruments such as a field effect transistor (FET) used in a liquid crystal display or an organic EL display and a device using a logic circuit such as an RF tag (RFID) or a memory, because the use of the organic thin film transistors makes it possible to achieve weight lightening and cost reduction and to impart properties such as excellent flexibility.

Generally, an organic thin film transistor is constituted with a substrate, a gate insulating film, an organic semiconductor layer, three electrodes (a gate electrode, a source electrode, and a drain electrode), and the like.

Among the members constituting the organic thin film transistor, a conductive film such as an electrode or wiring is known to be formed using a dispersion (a conductive film forming composition or a conductive paste) containing conductive particles (for example, particles constituted with a metal such as silver or copper).

For example, JP2014-67677A discloses a conductive paste containing silver particles and a migration suppressant (migration inhibitor) having a specific structure. According to the conductive paste described in JP2014-67677A, a silver layer excellently inhibiting migration and having excellent conductivity can be formed.

SUMMARY OF THE INVENTION

Incidentally, in recent years, in consideration of the environment, as a solvent in which conductive particles are dispersed, water has been used as a substitute for at least some of the organic solvents. In a case where water is used as a solvent in which conductive particles are dispersed, it is possible to gain advantages of being able to reduce an environmental load and being able to reduce the damage of a substrate coated with a conductive film forming composition or a gate insulating film.

However, if a highly hydrophobic migration suppressant (migration inhibitor) described in JP2014-67677A is used at the time of dispersing conductive particles by using water, coating properties of the conductive film forming composition deteriorate in some cases. The highly hydrophobic migration inhibitor described in JP2014-67677A causes the deterioration of the dispersibility of the conductive particles, and the deterioration is considered as one of the causes of the deterioration of the coating properties.

If the coating properties of the conductive film forming composition deteriorate, the smoothness (flatness) of the formed conductive film easily deteriorates. If so, voids occur in the conductive film, and accordingly, wiring failure (contact failure) occurs, or the crystal growth of an organic semiconductor layer (organic semiconductor film) formed in a state of contacting the conductive film is hindered. As a result, the mobility of an organic thin film transistor deteriorates.

In a case where a conductive film forming composition containing water as a solvent as described above is used, in order to improve the coating properties while inhibiting the occurrence of migration, the use of a migration inhibitor into which a hydrophilic group is introduced is considered.

However, depending on the structure thereof, the migration inhibitor into which a hydrophilic group is introduced causes the organic thin film transistor to absorb moisture in some cases. If the organic thin film transistor absorbs moisture as described above, migration more easily occurs, and hence insulation reliability deteriorates in some cases.

In the present invention, migration means a phenomenon in which a conductive substance such as a metal is ionized, and the ion migrates.

In a case where the conductive film forming composition containing water as a solvent is used, depending on the structure of the migration inhibitor contained in the composition, the mobility of the organic thin film transistor deteriorates due to the deterioration of the coating properties of the conductive film forming composition in some cases, or the insulation reliability deteriorates due to the absorption of moisture into the organic thin film transistor in some cases.

The present invention has been made in consideration of the aforementioned problems, and objects thereof are to provide a conductive film forming composition which makes it possible to prepare an organic thin film transistor having excellent insulation reliability while inhibiting the deterioration of mobility and has excellent coating properties and to provide a conductive film and an organic thin film transistor which are prepared using the composition. Other objects of the present invention are to provide electronic paper and a display device which contain the organic thin film transistor and to provide wiring board having wiring formed using the organic thin film transistor.

That is, the present invention provides the following [1] to [16].

[1] A conductive film forming composition comprising water, conductive particles, and a migration inhibitor containing a compound having a group represented by Formula (1).

In Formula (1) which will be described later, $W_1$ represents a hydrogen atom, a group represented by Formula (A), a group represented by Formula (B), or a group represented by Formula (C).

In Formula (1) which will be described later, $R_1$, $R_2$, $R_3$, and $R_4$ each independently represent any one of a hydrogen atom, a substituent, and $W_2$. $W_2$ represents a group represented by Formula (D), a group represented by Formula (E), or a group represented by Formula (F). Here, in a case where $W_1$ is a hydrogen atom, at least one of $R_1$, $R_2$, $R_3$, or $R_4$ is $W_2$.

In Formula (1) which will be described later, * represents a binding position.

In Formula (A) which will be described later, $Z_1$ represents a divalent linking group. $R_A$ represents an alkylene group having 1 to 4 carbon atoms. $R_5$ represents an alkyl group having 1 to 12 carbon atoms or an aryl group having 6 to 12 carbon atoms. n represents an integer of 4 to 100. * represents a binding position.

In Formula (B) which will be described later, $Z_2$ represents a divalent linking group. $A_1$ represents an anionic group. $R_6$, $R_7$, $R_8$, and $R_9$ each independently represent a hydrogen atom, an alkyl group having 1 to 12 carbon atoms, or an aryl group having 6 to 12 carbon atoms. * represents a binding position.

In Formula (C) which will be described later, $Z_3$ represents a divalent linking group. $A_2^-$ represents a monovalent anion. $R_{10}$, $R_{11}$, and $R_{12}$ each independently represent a hydrogen atom, an alkyl group having 1 to 12 carbon atoms, or an aryl group having 6 to 12 carbon atoms. * represents a binding position.

In Formula (D) which will be described later, $Z_4$ represents a single bond or a divalent linking group. $R_B$ represents an alkylene group having 1 to 4 carbon atoms. $R_{13}$ represents a hydrogen atom, an alkyl group having 1 to 12 carbon atoms, or an aryl group having 6 to 12 carbon atoms. m represents an integer of 4 to 100. * represents a binding position.

In Formula (E) which will be described later, $Z_5$ represents a single bond or a divalent linking group. $A_3^-$ represents an anionic group. $R_{14}$, $R_{15}$, $R_{16}$, and $R_{17}$ each independently represent a hydrogen atom, an alkyl group having 1 to 12 carbon atoms, or an aryl group having 6 to 12 carbon atoms. * represents a binding position.

In Formula (F) which will be described later, $Z_6$ represents a single bond or a divalent linking group. $A_4^-$ represents a monovalent anion. $R_{18}$, $R_{19}$, and $R_{20}$ each independently represent a hydrogen atom, an alkyl group having 1 to 12 carbon atoms, or an aryl group having 6 to 12 carbon atoms. * represents a binding position. [2] The conductive film forming composition according to [1], in which the compound having a group represented by Formula (1) is a compound represented by Formula (2).

In Formula (2) which will be described later, L represents a single bond or an (n+m)-valent linking group. In a case where L is a single bond, n=1, and m=1. In a case where L is an (n+m)-valent linking group, n and m are an integer and satisfy $1 \leq n \leq 6$, $0 \leq m \leq 5$, and $2 \leq n+m \leq 6$.

In Formula (2) which will be described later, Rx is a group represented by the following Formula (G). In a case where n is equal to or greater than 2, a plurality of Rx's may be the same as or different from each other.

In Formula (2) which will be described later, Ry is a hydrogen atom, a substituent, or a group represented by the following Formula (H). In a case where in is equal to or greater than 2, a plurality of Ry's may be the same as or different from each other.

In Formula (G) which will be described later, all of $W_1$, $R_1$, $R_2$, $R_3$, and $R_4$ have the same definition as a group represented by Formula (1) which will be described later. $Y_1$ represents a single bond or a divalent linking group. * represents a binding position. In Formula (H) which will be described later, $R_{21}$, $R_{22}$, $R_{23}$, and $R_{24}$ each independently represent a hydrogen atom or a substituent. $Y_2$ represents a single bond or a divalent linking group. * represents a binding position.

[3] The conductive film forming composition according to [1] or [2], in which in Formula (1) or Formula (2), $W_1$ is a group represented by Formula (I), a group represented by Formula (J), a group represented by Formula (K), or a group represented by Formula (L).

In Formula (I) which will be described later, $L_1$ represents an alkylene group having 1 to 12 carbon atoms or an arylene group having 6 to 12 carbon atoms. $R_{25}$ represents an alkyl group having 1 to 12 carbon atoms or an aryl group having 6 to 12 carbon atoms. n represents an integer of 4 to 100. * represents a binding position.

In Formula (J) which will be described later, $L_2$ represents an alkylene group having 1 to 12 carbon atoms or an arylene group having 6 to 12 carbon atoms. $R_{26}$ represents an alkyl group having 1 to 12 carbon atoms or an aryl group having 6 to 12 carbon atoms. m represents an integer of 4 to 100. * represents a binding position.

In Formula (K) which will be described later, $R_{27}$ represents an alkyl group having 1 to 12 carbon atoms or an aryl group having 6 to 12 carbon atoms. l represents an integer of 4 to 100. * represents a binding position.

In Formula (L) which will be described later, $L_3$ represents an alkylene group having 1 to 12 carbon atoms or an arylene group having 6 to 12 carbon atoms. $R_{28}$, $R_{29}$, $R_{30}$, and $R_{31}$ each independently represent a hydrogen atom, an alkyl group having 1 to 12 carbon atoms, or an aryl group having 6 to 12 carbon atoms. * represents a binding position.

[4] The conductive film forming composition according to any one of [1] to [3], in which in Formula (1) or Formula (2), $W_2$ is a group represented by Formula (M), a group represented by Formula (N), a group represented by Formula (O), or a group represented by Formula (P).

In Formula (M) which will be described later, $Z_7$ represents a single bond, a —COO— group, a —NHCO— group, or a —CONH— group. $L_4$ represents an alkylene group having 1 to 12 carbon atoms or an arylene group having 6 to 12 carbon atoms. $R_{32}$ represents an alkyl group having 1 to 12 carbon atoms or an aryl group having 6 to 12 carbon atoms. o represents an integer of 4 to 100. * represents a binding position.

In Formula (N) which will be described later, $Z_8$ represents a single bond, a —COO— group, a —NHCO— group, or a —CONH— group. $L_5$ represents an alkylene group having 1 to 12 carbon atoms or an arylene group having 6 to 12 carbon atoms. $R_{33}$ represents an alkyl group having 1 to 12 carbon atoms or an aryl group having 6 to 12 carbon atoms. p represents an integer of 4 to 100. * represents a binding position.

In Formula (O) which will be described later, $Z_9$ represents a single bond, a —COO— group, a —NHCO— group, or a —CONH— group. $L_6$ represents an alkylene group having 1 to 12 carbon atoms or an arylene group having 6 to 12 carbon atoms. $R_{34}$, $R_{35}$, $R_{36}$, and $R_{37}$ each independently represent a hydrogen atom, an alkyl group having 1 to 12 carbon atoms, or an aryl group having 6 to 12 carbon atoms. * represents a binding position.

In Formula (P) which will be described later, $Z_{10}$ represents a single bond, a —COO— group, a —NHCO— group, or a —CONH— group. $L_7$ represents an alkylene group having 1 to 12 carbon atoms or an arylene group having 6 to 12 carbon atoms. $R_{38}$ represents a hydrogen atom or an alkyl group having 1 to 5 carbon atoms. $R_{39}$, $R_{40}$, $R_{41}$, and $R_{42}$ each independently represent a hydrogen atom, an alkyl group having 1 to 12 carbon atoms, or an aryl group having 6 to 12 carbon atoms. * represents a binding position.

[5] A conductive film forming composition comprising water, conductive particles, and a migration inhibitor containing a compound having a group represented by Formula (3), in which an HLB value of the compound having a group represented by Formula (3) is 11 to 17.

In Formula (3) which will be described later, $W_{1A}$ represents a group represented by Formula (1A). $R_{1A}$ represents an alkyl group having 1 to 22 carbon atoms. $R_2$, $R_3$, and $R_4$ each independently represent any one of a hydrogen atom, a substituent, and $W_2$. $W_2$ represents a group represented by Formula (D), a group represented by Formula (E), or a group represented by Formula (F). * represents a binding position.

In Formula (1A) which will be described later, $Z_1$ represents a divalent linking group. $R_A$ represents an alkylene group having 1 to 4 carbon atoms. n represents an integer of 4 to 100. * represents a binding position.

In Formula (D) which will be described later, $Z_4$ represents a single bond or a divalent linking group. $R_B$ represents an alkylene group having 1 to 4 carbon atoms. $R_{13}$ represents a hydrogen atom, an alkyl group having 1 to 12 carbon atoms, or an aryl group having 6 to 12 carbon atoms. m represents an integer of 4 to 100. * represents a binding position.

In Formula (E) which will be described later, $Z_5$ represents a single bond or a divalent linking group. $A_3^-$ represents an anionic group. $R_{14}$, $R_{15}$, $R_{16}$, and $R_{17}$ each independently represent a hydrogen atom, an alkyl group having 1 to 12 carbon atoms, or an aryl group having 6 to 12 carbon atoms. * represents a binding position.

In Formula (F) which will be described later, $Z_6$ represents a single bond or a divalent linking group. $A_4$ represents a monovalent anion. $R_{18}$, $R_{19}$, and $R_{20}$ each independently represent a hydrogen atom, an alkyl group having 1 to 12 carbon atoms, or an aryl group having 6 to 12 carbon atoms. * represents a binding position.

[6] The conductive film forming composition according to [5], in which the compound having a group represented by Formula (3) is a compound represented by Formula (4).

In Formula (4) which will be described later, L represents a single bond or an (n+m)-valent linking group. In a case where L is a single bond, n=1, and m=1. In a case where L is an (n+m)-valent linking group, n and m are an integer and satisfy $1 \le n \le 6$, $0 \le m \le 5$, and $2 \le n+m \le 6$.

In Formula (4) which will be described later, $Rx_A$ is a group represented by the following Formula (GA). In a case where n is equal to or greater than 2, a plurality of $Rx_A$'S may be the same as or different from each other.

In Formula (4) which will be described later, Ry is a hydrogen atom, a substituent, or a group represented by the following Formula (H). In a case where m is equal to or greater than 2, a plurality of Ry's may be the same as or different from each other. In Formula (GA) which will be described later, all of $W_{1A}$, $R_{1A}$, $R_2$, $R_3$, and $R_4$ have the same definition as the group represented by Formula (3) which will be described later. $Y_1$ represents a single bond or a divalent linking group. * represents a binding position.

In Formula (H) which will be described later, $R_{21}$, $R_{22}$, $R_{23}$, and $R_{24}$ each independently represent a hydrogen atom or a substituent. $Y_2$ represents a single bond or a divalent linking group. * represents a binding position.

[7] The conductive film forming composition according to [5] or [6], in which in Formula (3) and Formula (4), $W_{1A}$ is a group represented by Formula (IA), a group represented by Formula (JA), or a group represented by Formula (KA).

In Formula (IA) which will be described later, $L_1$ represents an alkylene group having 1 to 12 carbon atoms or an arylene group having 6 to 12 carbon atoms. n represents an integer of 4 to 100. * represents a binding position.

In Formula (JA) which will be described later, $L_2$ represents an alkylene group having 1 to 12 carbon atoms or an arylene group having 6 to 12 carbon atoms. m represents an integer of 4 to 100. * represents a binding position.

In Formula (KA) which will be described later, l represents an integer of 4 to 100. * represents a binding position.

[8] The conductive film forming composition according to any one of [5] to [7], in which in Formula (3) or Formula (4), $W_2$ is a group represented by Formula (M), a group represented by Formula (N), a group represented by Formula (O), or a group represented by Formula (P).

In Formula (M) which will be described later, $Z_7$ represents a single bond, a —COO— group, a —NHCO— group, or a —CONH— group. $L_4$ represents an alkylene group having 1 to 12 carbon atoms or an arylene group having 6 to 12 carbon atoms. $R_{32}$ represents an alkyl group having 1 to 12 carbon atoms or an aryl group having 6 to 12 carbon atoms. o represents an integer of 4 to 100. * represents a binding position.

In Formula (N) which will be described later, $Z_8$ represents a single bond, a —COO— group, a —NHCO— group, or a —CONH— group. $L_5$ represents an alkylene group having 1 to 12 carbon atoms or an arylene group having 6 to 12 carbon atoms. $R_{33}$ represents an alkyl group having 1 to 12 carbon atoms or an aryl group having 6 to 12 carbon atoms. p represents an integer of 4 to 100. * represents a binding position.

In Formula (O) which will be described later, $Z_9$ represents a single bond, a —COO— group, a —NHCO— group, or a —CONH— group. $L_6$ represents an alkylene group having 1 to 12 carbon atoms or an arylene group having 6 to 12 carbon atoms. $R_{34}$, $R_{35}$, $R_{36}$, and $R_{37}$ each independently represent a hydrogen atom, an alkyl group having 1 to 12 carbon atoms, or an aryl group having 6 to 12 carbon atoms. * represents a binding position.

In Formula (P) which will be described later, $Z_{10}$ represents a single bond, a —COO— group, a —NHCO— group, or a —CONH— group. $L_7$ represents an alkylene group having 1 to 12 carbon atoms or an arylene group having 6 to 12 carbon atoms. $R_{38}$ represents a hydrogen atom or an alkyl group having 1 to 5 carbon atoms. $R_{39}$, $R_{40}$, $R_{41}$, and $R_{42}$ each independently represent a hydrogen atom, an alkyl group having 1 to 12 carbon atoms, or an aryl group having 6 to 12 carbon atoms. * represents a binding position.

[9] The conductive film forming composition according to any one of [1] to [8], in which an average particle size of the conductive particles is equal to or greater than 5 nm and equal to or less than 200 nm.

[10] The conductive film forming composition according to any one of [1] to [9], in which the conductive particles contain a metal atom selected from the group consisting of Ag, Cu, Al, Ni, and Ta.

[11] The conductive film forming composition according to any one of [1] to [10], in which a content of water is equal to or greater than 10% by mass with respect to a total mass of the conductive film forming composition.

[12] A conductive film formed using the conductive film forming composition according to any one of [1] to [11].

[13] An organic thin film transistor comprising an electrode formed using the conductive film forming composition according to any one of [1] to [11].

[14] Electronic paper comprising the organic thin film transistor according to [13].

[15] A display device comprising the organic thin film transistor according to [13].

[16] A wiring board comprising wiring formed using the conductive film forming composition according to any one of [1] to [11].

According to the present invention, it is possible to provide a conductive film forming composition which makes it possible to prepare an organic thin film transistor having excellent insulation reliability while inhibiting the deterioration of mobility and has excellent coating properties and to provide a conductive film and an organic thin film transistor which are prepared using the composition. Furthermore, according to the present invention, it is possible to provide electronic paper and a display device which contain the organic thin film transistor and to provide a wiring board having wiring formed using the conductive film forming composition.

DESCRIPTION OF THE PREFERRED EMBODIMENTS

Figure 1:
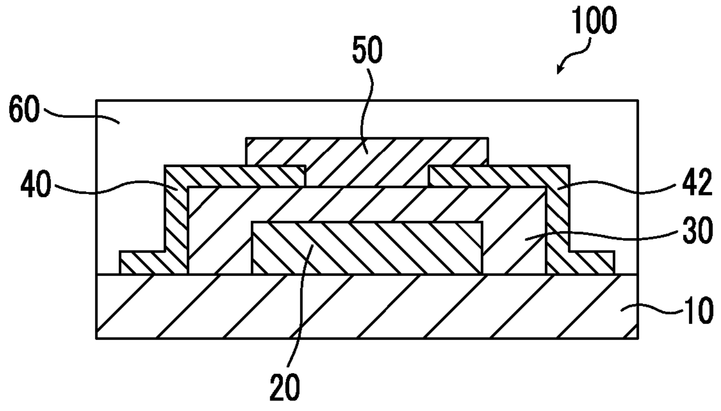
FIG. 1 is a schematic cross-sectional view of an aspect of an organic thin film transistor of the present invention.

Hereinafter, suitable embodiments of the present invention will be described. The embodiments described below explain an example of the present invention. The present invention is not limited to the following embodiments and includes various modification examples embodied within a scope that does not change the gist of the present invention.

In the present specification, in a case where there is no description regarding whether a group (atomic group) is substituted or unsubstituted, the group includes both of a group not having a substituent and a group having a substituent. For example, an "alkyl group" includes not only an alkyl group not having a substituent (unsubstituted alkyl group) but also an alkyl group having a substituent (substituted alkyl group).

In the present specification, a range of numerical values represented using "to" means a range including the numerical values listed before and after "to" as a lower limit and an upper limit respectively.

1. First Embodiment

1.1. Conductive Film Forming Composition

A conductive film forming composition according to the present embodiment contains water, conductive particles, and a migration inhibitor containing a compound having a group represented by Formula (1) which will be described later.

It is considered that the conductive film forming composition according to the present embodiment brings about desired effects because the composition is constituted as above. The mechanism that brings about such effects has not yet been completely clarified but is assumed to be as below.

If voltage is applied in a state where an organic thin film transistor has absorbed moisture, due to the action of an electric field, a conductive substance such as a metal in the electrode is ionized, and the ion migrates in the vicinity of the interface (including the interface with the air) of an organic semiconductor layer in some cases. The occurrence of the migration deteriorates insulation properties between a source electrode and a drain electrode (that is, deteriorates insulation reliability).

Therefore, for the purpose of inhibiting the occurrence of migration, a reducing compound (migration inhibitor) having a structure of phenol or the like is added to the conductive film forming composition in some cases. However, in a case where the conductive film forming composition containing water as a solvent is used as described above, depending on the structure of the migration inhibitor, the mobility of the organic thin film transistor deteriorates due to the deterioration of the coating properties of the conductive film forming composition in some cases, or the insulation reliability deteriorates due to the absorption of moisture into the conductive film in some cases.

As a result of conducting intensive investigation, the inventor of the present invention found that, in a case where a migration inhibitor containing a compound having a group represented by Formula (1) which will be described later (hereinafter, simply referred to as a "specific group" as well) is used, the aforementioned effects are obtained.

That is, because the specific group is highly hydrophilic, the compound having the specific group exhibits excellent solubility or dispersibility in the conductive film forming composition containing water as a solvent. Furthermore, because the compound having the specific group functions as a dispersant for the conductive particles in the conductive film forming composition in some cases, the dispersibility of the conductive particles can be improved. Consequently, when the conductive film forming composition according to the present embodiment is used for coating for forming a conductive film, a smooth surface can be formed (that is, the shape of the coating surface becomes excellent). If the shape of the coating surface of the conductive film is excellent as above, the occurrence of wiring failure of the conductive film can be inhibited, or the crystal growth of the organic semiconductor layer (organic semiconductor film) becomes excellent. As a result, the mobility of the organic thin film transistor becomes excellent.

The compound having the specific group has a property of turning into a hydrophobic structure with remaining a reducing mother nucleus by the heating at the time of forming a conductive film. That is, a portion of the chemical structure of the specific group is thermally decomposed by the heating at the time of forming a conductive film. Specifically, the inventor of the present invention found that, in a case where the compound having the specific group coexists with conductive particles (preferably silver), if the compound is heated under the conditions generally given at the time of forming a conductive film (electrode) of an organic thin film transistor (for example, heated for 1 to 3 hours at 150° C. to 250° C.), the compound turns into a hydrophobic structure with remaining a reducing mother nucleus. In contrast, in a case where the compound having the specific group is heated in the absence of conductive particles under the same conditions as described above, the thermal decomposition of the specific group does not easily occur, and the compound maintains the stable structure. That is, the inventor of the present invention found that, in a case where the compound having the specific group coexists with conductive particles, the thermal decomposition of the specific group easily proceeds. In this way, when the compound having the specific group turns into a hydrophobic structure, the absorption of moisture into the organic thin film transistor can be reduced. Furthermore, even when the compound turns into a hydrophobic structure, the compound sufficiently functions as a migration inhibitor. Accordingly, an organic thin film transistor having excellent insulation reliability can be obtained.

Hereinafter, the components contained in the conductive film forming composition according to the present embodiment and the components that can be contained in the composition will be specifically described.

1.1.1. Conductive Particles.

The conductive film forming composition according to the present embodiment contains conductive particles. In the present invention, "conductive" means conducting electricity, and the conductive particles are not particularly limited as long as they have a particle shape.

The particle shape refers to the shape of a small particle, and examples thereof include a spherical shape, an elliptical shape, and the like. The particle does not need to be a perfect sphere or ellipse and may be partially distorted.

As the conductive particles, various metal particles are preferable. Particularly, the conductive particles are preferably particles containing a metal atom selected from the group consisting of silver (Ag), copper (Cu), aluminum (Al), nickel (Ni), and tantalum (Ta), more preferably silver or copper, and even more preferably silver.

The conductive particles are preferably conductive nanoparticles.

In a case where the conductive particles are silver nanoparticles using silver, the preparation method thereof is not particularly limited. For example, the particles can be prepared by a method in which an aqueous solution of a reductant such as N,N-diethylhydroxylamine is added dropwise to an aqueous solution of a silver salt such as silver nitrate in the presence of a dispersant such that the silver salt is reduced by the reductant.

The average particle size of the conductive particles is preferably equal to or less than 200 nm, and more preferably equal to or less than 100 nm. The lower limit thereof is preferably equal to or greater than 5 nm. If the average particle size is within the above range, a fine wiring pattern can be formed, or the smoothness of the surface of the conductive film is improved.

In the present invention, an average particle size refers to an average primary particle size. By observing the particles by using a transmission electron microscope (TEM), particle sizes (diameters) of at least 50 or more conductive particles are measured, and an arithmetic mean thereof is calculated, whereby the average particle size is determined. In a case where the shape of the conductive particles in the observed picture is not a complete circle, the length of major axis thereof is measured as a diameter.

The content of the conductive particles according to the present embodiment is not particularly limited, but is, with respect to the total mass (100% by mass) of the conductive film forming composition, preferably 5.0% by mass to 80.0% by mass, and more preferably 10.0% by mass to 60.0% by mass.

1.1.2. Migration Inhibitor

The conductive film forming composition according to the present embodiment contains a migration inhibitor containing a compound having a group represented by the following Formula (1). In the present embodiment, the compound having a group represented by Formula (1) will be simply referred to as a "compound (1)" in some cases.

(1)

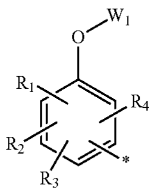

In Formula (1), $W_1$ represents a hydrogen atom, a group represented by Formula (A), a group represented by Formula (B), or a group represented by Formula (C). $W_1$ is preferably a hydrogen atom, a group represented by Formula (A), or a group represented by Formula (B), and more preferably a hydrogen atom or a group represented by Formula (A). Here, in a case where $W_1$ is a hydrogen atom, at least one of $R_1$, $R_2$, $R_3$, or $R_4$ which will be described later is $W_2$.

(A)

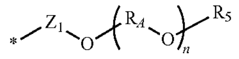

(B)

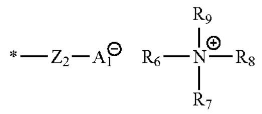

(C)

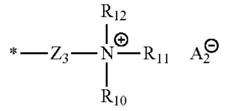

In Formula (A), $Z_1$ represents a divalent linking group.

Examples of the divalent linking group include a linear, branched, or cyclic divalent aliphatic hydrocarbon group (for example, an alkylene group having 1 to 12 carbon atoms, more specifically, a methylene group, an ethylene group, a propylene group, and the like), a linear, branched, or cyclic divalent aromatic hydrocarbon group (for example, an arylene group having 6 to 12 carbon atoms, more specifically, a phenylene group, a naphthylene group, and the like), —O—, —S—, $—SO_2—$, $—SO_3—$, $—SO_2NR_{50}—$, —CO—, —COO—, —O—CO—O—, $—CONR_{50}—$, $—NR_{50}—$, —NHCOO—, —NH—CO—NH—, a group obtained by combining a plurality of these (for example, an alkyleneoxy group, an alkyleneoxycarbonyl group, and an alkylene carbonyloxy group), and the like. $R_{50}$ represents a hydrogen atom or an alkyl group having 1 to 5 carbon atoms. * represents a binding position.

In Formula (A), $R_A$ represents an alkylene group having 1 to 4 carbon atoms. From the viewpoint of improving hydrophilicity, $R_A$ is preferably an alkylene group having 1 to 4 carbon atoms. From the viewpoint of the balance between hydrophilicity and stability, $R_A$ is more preferably an ethylene group or a propylene group, and particularly preferably an ethylene group.

In a case where $R_A$ is an alkylene group having more than 5 carbon atoms, sufficient hydrophilicity is not obtained, and the coating properties of the conductive film forming composition deteriorate.

In Formula (A), $R_5$ represents an alkyl group having 1 to 12 carbon atoms or an aryl group having 6 to 12 carbon atoms. If $R_5$ represents such an alkyl group or aryl group, the hydrophobicity can be improved.

In Formula (A), n represents an integer of 4 to 100. A suitable range of n can be appropriately determined according to the balance between the hydrophilic group and the hydrophobic group the group represented by Formula (1) has. The upper limit of n is preferably equal to or less than 80, more preferably equal to or less than 50, and even more preferably equal to or less than 30. From the same viewpoint, the lower limit thereof is preferably equal to or greater than 5, more preferably equal to or greater than 6, and even more preferably equal to or greater than 9.

In Formula (B), $Z_2$ represents a divalent linking group. The definition of the divalent linking group is as described above.

In Formula (B), $A_1^-$ represents an anionic group. Examples of the anionic group include —$COO^-$, —$PO_3m^-$, —$OPO_3R_{60}^-$, —$SO_3^-$, and the like. $R_{60}$ represents a hydrogen atom or an alkyl group having 1 to 5 carbon atoms.

Among monovalent anionic groups, it is preferable to use —$COO^-$ or —$PO_3R_{60}^-$, because these are easily decomposed at the time of heating performed for forming a conductive film and can reduce the absorption of moisture into the organic thin film transistor.

In Formula (B), $R_6$, $R_7$, $R_8$, and $R_9$ each independently represent a hydrogen atom, an alkyl group having 1 to 12 carbon atoms, or an aryl group having 6 to 12 carbon atoms, preferably represent a hydrogen atom or an alkyl group having 1 to 12 carbon atoms, and more preferably represent an alkyl group having 1 to 12 carbon atoms.

In Formula (C), $Z_3$ represents a divalent linking group. The definition of the divalent linking group is as described above. * represents a binding position.

In Formula (C), $R_{10}$, $R_{11}$, and $R_{12}$ each independently represent a hydrogen atom, an alkyl group having 1 to 12 carbon atoms, or an aryl group having 6 to 12 carbon atoms, preferably represent a hydrogen atom or an alkyl group having 1 to 12 carbon atoms, and even more preferably represent an alkyl group having 1 to 12 carbon atoms.

In Formula (C), $A_2^-$ represents a monovalent anion. Examples of the monovalent anion include a halogen anion (a chloride ion, a bromide ion, an iodide ion, a fluoride ion, and the like), an inorganic anion (a perchlorate ion, a chlorate ion, a thiocyanate ion, a hexafluorophosphate ion, a hexafluoroantimonate ion, a hexafluoroarsenate ion, a tetrafluoroborate ion, and the like), an organic fluorosulfonyl imide ion (a bis(trifluoromethansulfonyl)imide ion and the like), a sulfonate-based anion ($R_{70}$—$SO_3^-$ and the like), a phosphate-based anion ($R_{70}$—$PO_3R_{60}^-$, $R_{70}$—$OPO_3R_{60}^-$, and the like), a borate-based anion (a tetrakis(pentafluorophenyl)borate anion and the like), a carboxylate-based anion ($R_{70}$—$COO^-$ and the like), and the like. $R_{60}$ represents a hydrogen atom or an alkyl group having 1 to 5 carbon atoms. $R_{70}$ represents a hydrogen atom, an alkyl group, or an aryl group.

In Formula (1), $R_1$, $R_2$, $R_3$, and $R_4$ each independently represent any one of a hydrogen atom, a substituent, and $W_2$.

The group represented by Formula (1) preferably basically consists of —O—$W_1$ in which a substituent is introduced into at least the ortho-position, more preferably basically consists of —O—$W_1$ in which a substituent is introduced into the ortho-position and a substituent or $W_2$ is introduced into the para-position.

In a case where a substituent is introduced into the ortho-position, the substituent is preferably an alkyl group or an aryl group, and more preferably an alkyl group having a branched structure. If the substituent is such an alkyl group, the hydrophobicity of the compound (1) can be improved. Accordingly, the hygroscopicity of the obtained organic thin film transistor can be reduced, and the insulation reliability is improved.

In a case where $W_1$ is a hydrogen atom, at least one of $R_1$, $R_2$, $R_3$, or $R_4$ needs to be $W_2$, and at this time, $W_2$ is preferably introduced into the para-position.

In a case where $W_1$ is a group other than a hydrogen atom, a substituent is preferably introduced into the para-position. The substituent is more preferably an alkyl group or an aryl group, and even more preferably an alkyl group having a branched structure. If the substituent is such an alkyl group, the hydrophobicity of the compound (1) can be improved. Accordingly, the hygroscopicity of the obtained organic thin film transistor can be reduced, and the insulation reliability is improved.

Examples of the aforementioned substituent include a halogen atom, an alkyl group (including a cycloalkyl group), an alkenyl group (including a cycloalkenyl group and a bicycloalkenyl group), an alkynyl group, an aryl group, a heterocyclic group, a cyano group, a hydroxyl group, a nitro group, a carboxyl group, an alkoxy group, an aryloxy group, a silyloxy group, a heterocyclic oxy group, an acyloxy group, a carbamoyloxy group, an alkoxycarbonyloxy group, aryloxycarbonyloxy group, an amino group (including an anilino group), an acylamino group, an aminocarbonylamino group, an alkoxycarbonylamino group, an aryloxycarbonylamino group, a sulfamoylamino group, alkyl and aryl sulfonylamino groups, a mercapto group, an alkylthio group, an arylthio group, a heterocyclic thio group, a sulfamoyl group, a sulfo group, alkyl and aryl sulfinyl groups, alkyl and aryl sulfonyl groups, an acyl group, an aryloxycarbonyl group, an alkoxycarbonyl group, a carbamoyl group, aryl and heterocyclic azo groups, an imide group, a phosphino group, a phosphinyl group, a phosphinyloxy group, a phosphinylamino group, a silyl group, a combination of these, and the like.

More specifically, the substituent means a halogen atom (for example, a chlorine atom, a bromine atom, or an iodine atom), an alkyl group [(it means a substituted or unsubstituted linear, branched, or cyclic alkyl group; these also include an alkyl group (preferably an alkyl group having 1 to 30 carbon atoms, for example, methyl, ethyl, n-propyl, isopropyl, t-butyl, n-octyl, eicosyl, 2-chloroethyl, 2-cyanoethyl, or 2-ethylhexyl), a cycloalkyl group (preferably a substituted or unsubstituted cycloalkyl group having 3 to 30 carbon atoms, for example, cyclohexyl, cyclopentyl, or 4-n-dodecylcyclohexyl), a bicycloalkyl group (preferably a substituted or unsubstituted bicycloalkyl group having 5 to 30 carbon atoms, that is, a monovalent group obtained by removing one hydrogen atom from bicycloalkane having 5 to 30 carbon atoms, for example, bicyclo[1.2.2]heptan-2-yl or bicyclo[2.2.2]octan-3-yl), a tricyclo structure consisting of a large number of cyclic structures, and the like. An alkyl group in a substituent described below (for example, an alkyl group of an alkylthio group) also means the alkyl group having the concept described above], an alkenyl group [it means a substituted or unsubstituted linear, branched, or cyclic alkenyl group; these also include an alkenyl group (preferably a substituted or unsubstituted alkenyl group having 2 to 30 carbon atoms, for example, vinyl, allyl, prenyl, geranyl, or oleyl), a cycloalkenyl group (preferably a substituted or unsubstituted cycloalkenyl group having 3 to 30 carbon atoms, that is, a monovalent group obtained by removing one hydrogen atom from cycloalkene having 3 to 30 carbon atoms, for example, 2-cyclopenten-1-yl or 2-cyclohexen-1-yl), and a bicycloalkenyl group (a substituted or unsubstituted bicycloalkenyl group and preferably a substituted or unsubstituted bicycloalkenyl group having 5 to 30 carbon atoms, that is, a monovalent group obtained by removing one hydrogen atom from bicycloalkene having one double bond, for example, bicyclo[2.2.1]hept-2-en-1-yl or bicyclo[2.2.2]oct-2-en-4-yl)],

- an alkynyl group (preferably a substituted or unsubstituted alkynyl group having 2 to 30 carbon atoms, for example, an ethynyl, propargyl, or trimethylsilylethynyl group),
- an aryl group (preferably a substituted or unsubstituted aryl group having 6 to 30 carbon atoms, for example, phenyl, p-tolyl, naphthyl, m-chlorophenyl, or o-hexadecanoylaminophenyl),
- a heterocyclic group (preferably a monovalent group obtained by removing one hydrogen atom from a 5-membered or 6-membered substituted or unsubstituted aromatic or non-aromatic heterocyclic compound, more preferably, a 5-membered or 6-membered aromatic heterocyclic group having 3 to 30 carbon atoms, for example, 2-furanyl, 2-thienyl, 2-pyrimidinyl, or 2-benzothiazolinyl),
- a cyano group,
- a hydroxyl group,
- a nitro group,
- a carboxyl group,
- an alkoxy group (preferably a substituted or unsubstituted alkoxy group having 1 to 30 carbon atoms, for example, methoxy, ethoxy, isopropoxy, t-butoxy, n-octyloxy, or 2-methoxyethoxy),
- an aryloxy group (preferably a substituted or unsubstituted aryloxy group having 6 to 30 carbon atoms, for example, phenoxy, 2-methylphenoxy, 4-t-butylphenoxy, 3-nitrophenoxy, or 2-tetradecanoylaminophenoxy),
- a silyloxy group (preferably a silyloxy group having 3 to 20 carbon atoms, for example, trimethylsilyloxy or t-butyldimethylsilyloxy),
- a heterocyclic oxy group (preferably a substituted or unsubstituted heterocyclic oxy group having 2 to 30 carbon atoms, 1-phenyltetrazol-5-oxy or 2-tetrahydropyranyloxy),
- an acyloxy group (preferably a formyloxy group, a substituted or unsubstituted alkylcarbonyloxy group having 2 to 30 carbon atoms, or a substituted or unsubstituted arylcarbonyloxy group having 6 to 30 carbon atoms, for example, formyloxy, acetyloxy, pivaloyloxy, stearoyloxy, benzoyloxy, or p-methoxyphenylcarbonyloxy),
- a carbamoyloxy group (preferably a substituted or unsubstituted carbamoyloxy group having 1 to 30 carbon atoms, for example, N,N-dimethylcarbamoyloxy, N,N-diethylcarbamoyloxy, morpholinocarbonyloxy, N,N-di-n-octylaminocarbonyloxy, or N-n-octylcarbamoyloxy),
- an alkoxycarbonyloxy group (preferably a substituted or unsubstituted alkoxycarbonyloxy group having 2 to 30 carbon atoms, for example, methoxycarbonyloxy, ethoxycarbonyloxy, t-butoxycarbonyloxy, or n-octylcarbonyloxy),
- an aryloxycarbonyloxy group (preferably a substituted or unsubstituted aryloxycarbonyloxy group having 7 to 30 carbon atoms, for example, phenoxycarbonyloxy, p-methoxyphenoxycarbonyloxy, or p-n-hexadecyloxyphenoxycarbonyloxy),
- an amino group (preferably an amino group, a substituted or unsubstituted alkylamino group having 1 to 30 carbon atoms, or a substituted or unsubstituted anilino group having 6 to 30 carbon atoms, for example, amino, methylamino, dimethylamino, anilino, N-methyl-anilino, or diphenylamino),
- an acylamino group (preferably a formylamino group, a substituted or unsubstituted alkylcarbonylamino group having 1 to 30 carbon atoms, or a substituted or unsubstituted arylcarbonylamino group having 6 to 30 carbon atoms, for example, formylamino, acetylamino, pivaloylamino, lauroylamino, benzoylamino, 3,4,5-tri-n-octyloxyphenylcarbonylamino),

- an aminocarbonylamino group (preferably substituted or unsubstituted aminocarbonylamino having 1 to 30 carbon atoms, for example, carbamoylamino, N,N-dimethylaminocarbonylamino, N,N-diethylaminocarbonylamino, or morpholinocarbonylamino),
- an alkoxycarbonylamino group (preferably a substituted or unsubstituted alkoxycarbonylamino group having 2 to 30 carbon atoms, for example, methoxycarbonylamino, ethoxycarbonylamino, t-butoxycarbonylamino, n-octadecyloxycarbonylamino, or N-methyl-methoxycarbonylamino),
- an aryloxycarbonylamino group (preferably a substituted or unsubstituted aryloxycarbonylamino group having 7 to 30 carbon atoms, for example, phenoxycarbonylamino, p-chlorophenoxycarbonylamino, or m-n-octyloxyphenoxycarbonylamino),
- a sulfamoylamino group (preferably a substituted or unsubstituted sulfamoylamino group having 0 to 30 carbon atoms, for example, sulfamoylamino, N,N-dimethylaminosulfonylamino, or N-n-octylaminosulfonylamino),
- alkyl and aryl sulfonylamino groups (preferably substituted or unsubstituted alkylsulfonylamino having 1 to 30 carbon atoms and substituted or unsubstituted arylsulfonylamino having 6 to 30 carbon atoms, for example, methylsulfonylamino, butylsulfonylamino, phenylsulfonylamino, 2,3,5-trichlorophenylsulfonylamino, or p-methylphenylsulfonylamino),
- a mercapto group,
- an alkylthio group (preferably a substituted or unsubstituted alkylthio group having 1 to 30 carbon atoms, for example, methylthio, ethylthio, or n-hexadecylthio),
- an arylthio group (preferably substituted or unsubstituted aryltho having 6 to 30 carbon atoms, for example, phenylthio, p-chlorophenylthio, or m-methoxyphenylthio),
- a heterocyclic thio group (preferably a substituted or unsubstituted heterocyclic thio group having 2 to 30 carbon atoms, for example, 2-benzothiazolylthio or 1-phenyltetrazol-5-ylthio),
- a sulfamoyl group (preferably a substituted or unsubstituted sulfamoyl group having 0 to 30 carbon atoms, for example, N-ethylsulfamoyl, N-(3-dodecyloxypropyl) sulfamoyl, N,N-dimethylsulfamoyl, N-acetylsulfamoyl, N-benzoylsulfamoyl, or N—(N'-phenylcarbamoyl)sulfamoyl),
- a sulfo group,
- alkyl and aryl sulfinyl groups (preferably a substituted or unsubstituted alkylsulfinyl group having 1 to 30 carbon atoms and a substituted or unsubstituted arylsulfinyl group having 6 to 30 carbon atoms, for example, methylsulfinyl, ethylsulfinyl, phenylsulfinyl, or p-methylphenylsulfinyl),
- alkyl and aryl sulfonyl groups (preferably a substituted or unsubstituted alkylsulfonyl group having 1 to 30 carbon atoms and a substituted or unsubstituted arylsulfonyl group having 6 to 30 carbon atoms, for example, methylsulfonyl, ethylsulfonyl, phenylsulfonyl, and p-methylphenylsulfonyl),
- an acyl group (preferably a formyl group, a substituted or unsubstituted alkylcarbonyl group having 2 to 30 carbon atoms, a substituted or unsubstituted arylcarbonyl group having 7 to 30 carbon atoms, or a substituted or unsubstituted heterocyclic carbonyl group having 4 to 30 carbon atoms that is bonded to a carbonyl group through carbon atoms, for example, acetyl, pivaloyl, 2-chloroacetyl, stearoyl, benzoyl, p-n-octyloxyphenylcarbonyl, 2-pyridylcarbonyl, or 2-furylcarbonyl), an aryloxycarbonyl group (preferably a substituted or unsubstituted aryloxycarbonyl group having 7 to 30 carbon atoms, for example, phenoxycarbonyl, o-chlorophenoxycarbonyl, m-nitrophenoxycarbonyl, or p-t-butylphenoxycarbonyl), an alkoxycarbonyl group (preferably a substituted or unsubstituted alkoxycarbonyl group having 2 to 30 carbon atoms, for example, methoxycarbonyl, ethoxycarbonyl, t-butoxycarbonyl, or n-octadecyloxycarbonyl), a carbamoyl group (preferably substituted or unsubstituted carbamoyl having 1 to 30 carbon atoms, for example, carbamoyl, N-methylcarbamoyl, N,N-dimethylcarbamoyl, N,N-di-n-octylcarbamoyl, or N-(methylsulfonyl)carbamoyl), aryl and heterocyclic azo groups (preferably a substituted or unsubstituted arylazo group having 6 to 30 carbon atoms and a substituted or unsubstituted heterocyclic azo group having 3 to 30 carbon atoms, for example, phenylazo, p-chlorophenylazo, and 5-ethylthio-1,3,4-thiadiazol-2-ylazo), an imide group (preferably N-succinimide or N-phthalimide), a phosphino group (preferably a substituted or unsubstituted phosphino group having 2 to 30 carbon atoms, for example, dimethylphosphino, diphenylphosphino, or methylphenoxyphosphino), a phosphinyl group (preferably a substituted or unsubstituted phosphinyl group having 2 to 30 carbon atoms, for example, phosphinyl, dioctyloxyphosphinyl, or diethoxyphosphinyl), a phosphinyloxy group (preferably a substituted or unsubstituted phosphinyloxy group having 2 to 30 carbon atoms, for example, diphenoxyphosphinyloxy or dioctyloxyphosphinyloxy), a phosphinylamino group (preferably a substituted or unsubstituted phosphinylamino group having 2 to 30 carbon atoms, for example, dimethoxyphosphinylamino or dimethylaminophosphinylamino), or a silyl group (preferably a substituted or unsubstituted silyl group having 3 to 30 carbon atoms, for example, trimethylsilyl, t-butyldimethylsilyl, or phenyldimethylsilyl).

Among the above substituents, those having a hydrogen atom may be substituted with the aforementioned groups after the hydrogen atom is removed. Examples of the substituent include an alkylcarbonylaminosulfonyl group, an arylcarbonylaminosulfonyl group, an alkylsulfonylaminocarbonyl group, an arylsulfonylaminocarbonyl group, and the like. Examples thereof include methylsulfonylaminocarbonyl, p-methylphenylsulfonylaminocarbonyl, acetylaminosulfonyl, benzoylaminosulfonyl groups, and the like.

In the present invention, the meaning of a "substituent" is as described above.

In the present invention, an alkyl group and an aryl group each have the same definition as an alkyl group and an aryl group in the aforementioned substituents.

$W_2$ represents a group represented by Formula (D), a group represented by Formula (E), or a group represented by Formula (F). $W_2$ is preferably a group represented by Formula (D) or a group represented by Formula (E), and more preferably a group represented by Formula (D). If $W_2$ represents the aforementioned group, the aforementioned effects tend to be further improved.

(D)

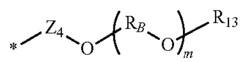

(E)

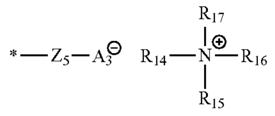

(F)

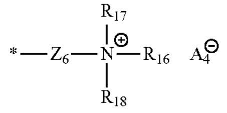

In Formula (D), $Z_4$ represents a single bond or a divalent linking group. $Z_4$ is preferably a divalent linking group, and more preferably an alkylene group. Being a single bond means that, for example, a group represented by *—$Z_4$—O— is *—O—. The definition of the divalent linking group is as described above. * represents a binding position.

In Formula (D), $R_B$ represents an alkylene group having 1 to 4 carbon atoms. From the viewpoint of improving hydrophilicity, $R_B$ is preferably an alkylene group having 1 to 4 carbon atoms. From the viewpoint of the balance between hydrophilicity and stability, $R_B$ is more preferably an ethylene group or a propylene group, and particularly preferably an ethylene group.

In a case where $R_B$ is an alkylene group having more than 5 carbon atoms, sufficient hydrophilicity is not obtained, and the coating properties of the conductive film forming composition deteriorate.

In Formula (D), $R_{13}$ represents a hydrogen atom, an alkyl group having 1 to 12 carbon atoms, or an aryl group having 6 to 12 carbon atoms. From the viewpoint of improving hydrophobicity, $R_{13}$ is preferably an alkyl group having 1 to 12 carbon atoms or an aryl group having 6 to 12 carbon atoms.

In Formula (D), m represents an integer of 4 to 100. A suitable range of m can be appropriately determined according to the balance between the hydrophilic group and the hydrophobic group that the group represented by Formula (1) has. The upper limit thereof is preferably equal to or less than 80, more preferably equal to or less than 50, and even more preferably equal to or less than 30. From the same viewpoint, the lower limit thereof is preferably equal to or greater than 5, more preferably equal to or greater than 6, and even more preferably equal to or greater than 9.

In Formula (E), $Z_5$ represents a single bond or a divalent linking group. $Z_5$ is preferably a divalent linking group. The definitions of the single bond and the divalent linking group are as described above. * represents a binding position.

In Formula (E), $A_3^-$ represents an anionic group. The anionic group has the same definition as $A_1^-$ in Formula (B) described above.

In Formula (E), $R_{14}$, $R_{15}$, $R_{16}$, and $R_{17}$ each independently represent a hydrogen atom, an alkyl group having 1 to 12 carbon atoms, or an aryl group having 6 to 12 carbon atom, preferably represent a hydrogen atom or an alkyl group having 1 to 12 carbon atoms, and more preferably represent an alkyl group having 1 to 12 carbon atoms.

In Formula (F), $Z_6$ represents a single bond or a divalent linking group. The definitions of the single bond and the divalent linking group are as described above. * represents a binding position.

In Formula (F), $R_{18}$, $R_{19}$, and $R_{20}$ each independently represent a hydrogen atom, an alkyl group having 1 to 12 carbon atoms, or an aryl group having 6 to 12 carbon atoms, preferably represent a hydrogen atom or an alkyl group having 1 to 12 carbon atoms, and even more preferably represent an alkyl group having 1 to 12 carbon atoms.

In Formula (F), $A_4^-$ represents a monovalent anion. The monovalent anion has the same definition as $A_2$ in Formula (C) described above.

The compound having a group represented by Formula (1) is preferably a compound represented by the following Formula (2).

$$(Rx)_n\text{-L-}(Ry)_m \quad (2)$$

In Formula (2), L represents a single bond or an (n+m)-valent linking group. In a case where L is a single bond, n=1, m=1, and Formula (2) is represented by Rx-Ry. In a case where L is an (n+m)-valent linking group, n and m represent an integer and satisfy 1≤n≤6, 0≤m≤5, and 2≤n+m≤6.

In a case where L is an (n+m)-valent linking group, examples of L include an alkylene group having 1 to 10 carbon atoms (in this case, n+m=2) and a group represented by any of the following Formulae (L-1) to (L-9) and (L-10). Among these, an alkylene group having 1 to 10 carbon atoms is preferable. In Formula (L-10), Lx represents a single bond or a divalent linking group, and the definition of the divalent linking group is as described above.

Among these, L is preferably a single bond or a divalent linking group (preferably an alkylene group having 1 to 10 carbon atoms), and more preferably a single bond.

Formula (L-1)

*—S—S—*

Formula (L-2)

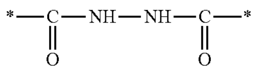

Formula (L-3)

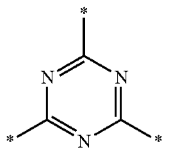

Formula (L-4)

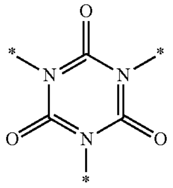

Formula (L-5)

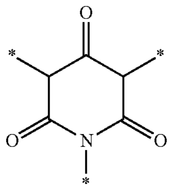

Formula (L-7)

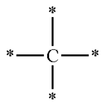

-continued

Formula (L-8)

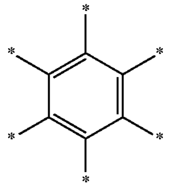

Formula (L-9)

*—S—*

Formula (L-6)

*—O—*

Formula (L-10)

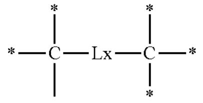

In Formula (2), Rx is a group represented by the following Formula (G). In a case where n is equal to or greater than 2, a plurality of Rx's may be the same as or different from each other.

In Formula (2), Ry is a hydrogen atom, a substituent, or a group represented by the following Formula (H). In a case where m is equal to or greater than 2, a plurality of Ry's may be the same as or different from each other. The definition of the substituent is as described above.

(G)

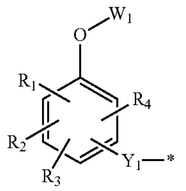

(H)

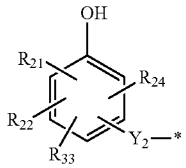

In Formula (G), all of $W_1$, $R_1$, $R_2$, $R_3$, and $R_4$ have the same definition as the group represented by Formula (1) described above.

$Y_1$ represents a single bond or a divalent linking group, and the definitions thereof are as described above. * represents a binding position.

In Formula (H), $R_{21}$, $R_{22}$, $R_{23}$, and $R_{24}$ each independently represent a hydrogen atom or a substituent, and preferably represent a hydrogen atom or an alkyl group. * represents a binding position. The definition of the substituent is as described above.

$Y_2$ represents a single bond or a divalent linking group, and definitions of these are as described above. * represents a binding position. In a case where Ry is a group represented by Formula (H), both of the position of $Y_1$ based on —O—$W_1$ and the position of $Y_2$ based on a —OH group are preferably the ortho-position or the para-position.

$W_1$ in Formula (1) and Formula (2) described above is preferably a group represented by Formula (I), a group represented by Formula (J), a group represented by Formula (K), or a group represented by Formula (L), because then the effects of the present invention are more markedly exhibited.

(I)

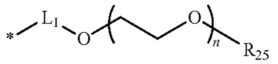

(J)

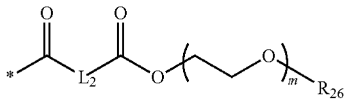

(K)

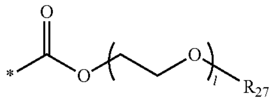

(L)

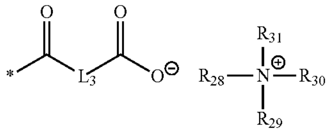

In Formula (I), Formula (J), Formula (K), and Formula (L), $L_1$, $L_2$, and $L_3$ each independently represent an alkylene group having 1 to 12 carbon atoms or an arylene group having 6 to 12 carbon atoms, and preferably represent an alkylene group having 1 to 12 carbon atoms.

In Formula (I), Formula (J), and Formula (K), $R_{25}$, $R_{26}$, and $R_{27}$ each independently represent an alkyl group having 1 to 12 carbon atoms or an aryl group having 6 to 12 carbon atoms.

In Formula (I), Formula (J), and Formula (K), n, m, and l each independently represent an integer of 4 to 100. A suitable range thereof can be appropriately determined according to the balance between the hydrophilic group and the hydrophobic group that the group represented by Formula (1) has. The upper limit thereof is preferably equal to or less than 80, more preferably equal to or less than 50, and even more preferably equal to or less than 30. From the same viewpoint, the lower limit thereof is preferably equal to or greater than 5, more preferably equal to or greater than 6, and even more preferably equal to or greater than 9.

In Formula (L), $R_{28}$, $R_{29}$, $R_{30}$, and $R_{31}$ each independently represent a hydrogen atom, an alkyl group having 1 to 12 carbon atoms, or an aryl group having 6 to 12 carbon atoms.

In Formula (I), Formula (J), Formula (K), and Formula (L), * represents a binding position.

In Formulae (I) to (L), $W_1$ is preferably Formula (I), Formula (J), or Formula (K). If $W_1$ is represented by such a formula, the aforementioned effects tend to be further improved.

$W_2$ in Formula (1) and Formula (2) described above is preferably a group represented by Formula (M), a group represented by Formula (N), a group represented by Formula (O), or a group represented by Formula (P), because then the effects of the present invention are more markedly exhibited.

(M)

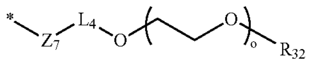

(N)

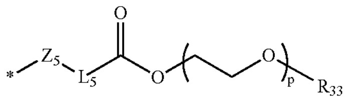

-continued (O)

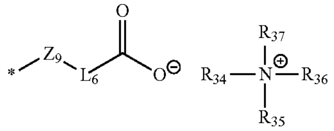

(P)

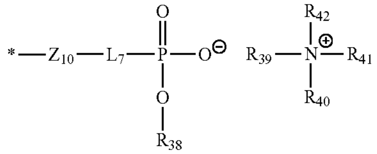

In Formula (M), Formula (N), Formula (O), and Formula (P), $Z_7$, $Z_8$, $Z_9$, and $Z_{10}$ each independently represent a single bond, a —COO— group, a —NHCO— group, or a —CONH— group, and preferably represent a single bond.

In Formula (M), Formula (N), Formula (O), and Formula (P), $L_4$, $L_5$, $L_6$, and $L_7$ each independently represent an alkylene group having 1 to 12 carbon atoms or an arylene group having 6 to 12 carbon atoms, and preferably represent an alkylene group having 1 to 12 carbon atoms.

In Formula (M) and Formula (N), $R_{32}$ and $R_{33}$ each independently represent an alkyl group having 1 to 12 carbon atoms or an aryl group having 6 to 12 carbon atoms. From the viewpoint of improving hydrophobicity, $R_{32}$ and $R_{33}$ preferably represent an alkyl group having 1 to 12 carbon atoms or an aryl group having 6 to 12 carbon atoms.

In Formula (M) and Formula (N), o and p each independently represent an integer of 4 to 100. A suitable range thereof can be appropriately determined according to the balance between the hydrophilic group and the hydrophobic group that the group represented by Formula (1) has. The upper limit thereof is preferably equal to or less than 80, more preferably equal to or less than 50, and even more preferably equal to or less than 30. From the same viewpoint, the lower limit thereof is preferably equal to or greater than 5, more preferably equal to or greater than 6, and even more preferably equal to or greater than 9.

In Formula (O), $R_{34}$, $R_{35}$, $R_{36}$, and $R_{37}$ each independently represent a hydrogen atom, an alkyl group having 1 to 12 carbon atoms, or an aryl group having 6 to 12 carbon atoms. In Formula (P), $R_{38}$ represents a hydrogen atom or an alkyl group having 1 to 5 carbon atoms. $R_{39}$, $R_{40}$, $R_{41}$, and $R_{42}$ each independently represent a hydrogen atom, an alkyl group having 1 to 12 carbon atoms, or an aryl group having 6 to 12 carbon atoms.

In Formula (M), Formula (N), Formula (O), and Formula (P), * represents a binding position.

Specific examples of the compound (1) include compounds represented by the following formulae.

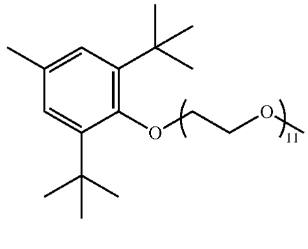

-continued
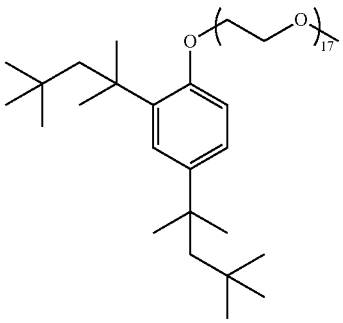
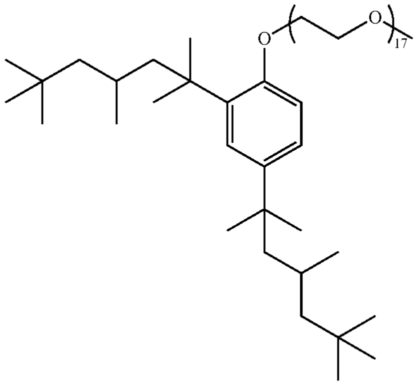
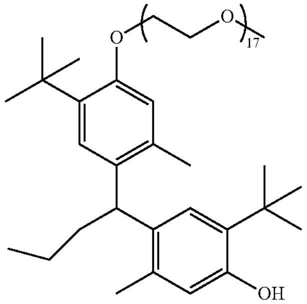
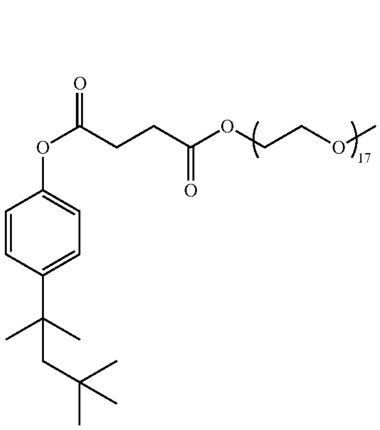
-continued
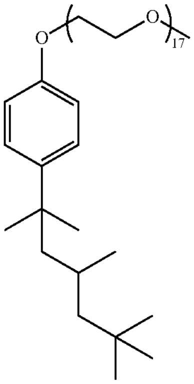
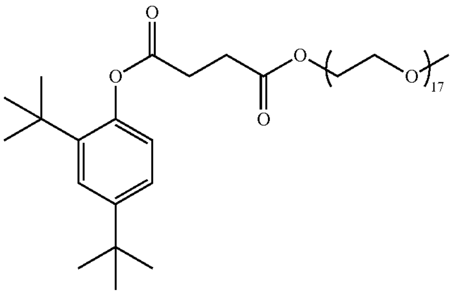
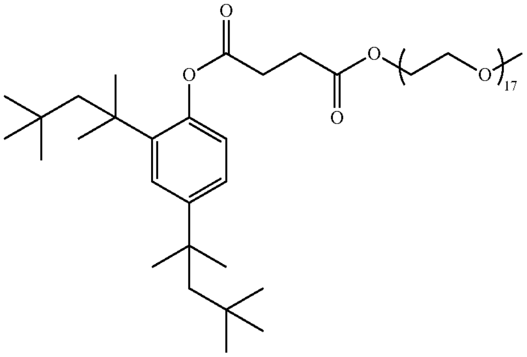
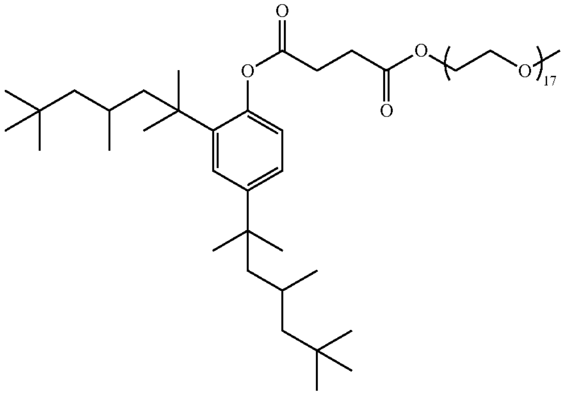
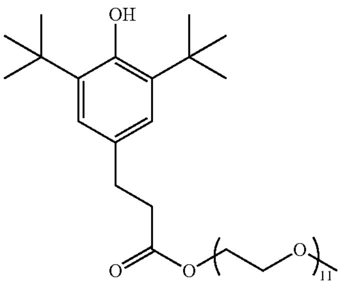

-continued
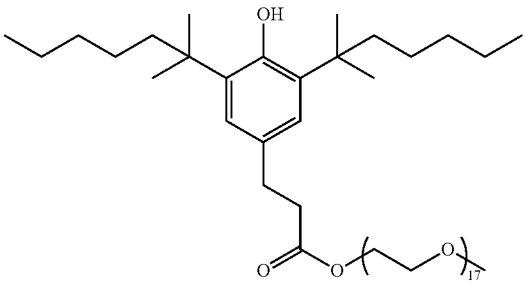
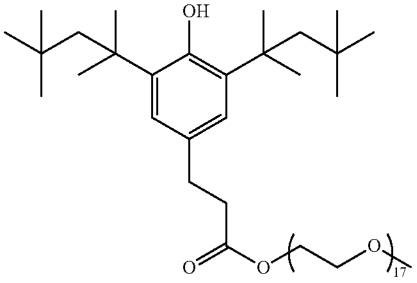
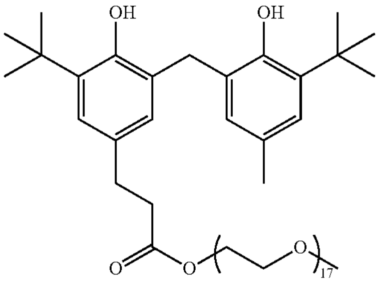
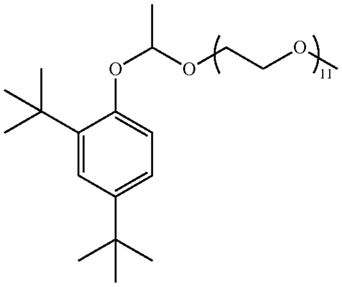
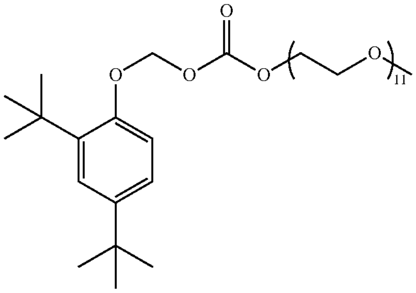
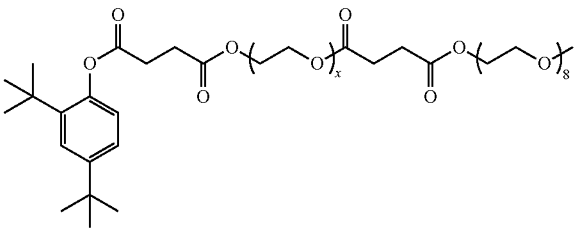
-continued
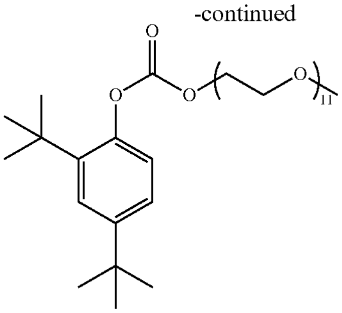
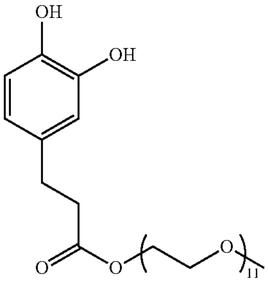
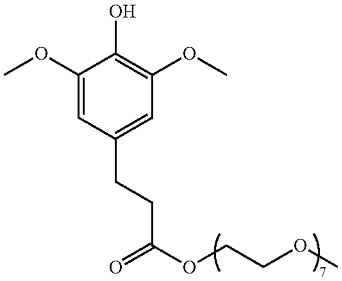
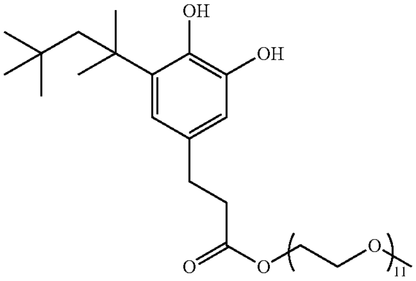
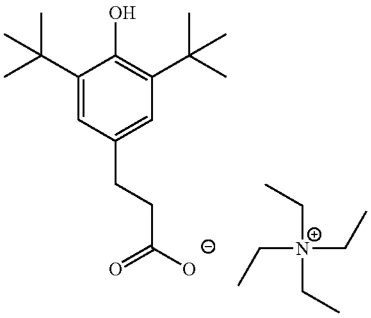

-continued
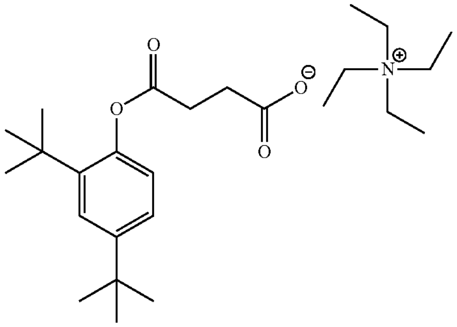
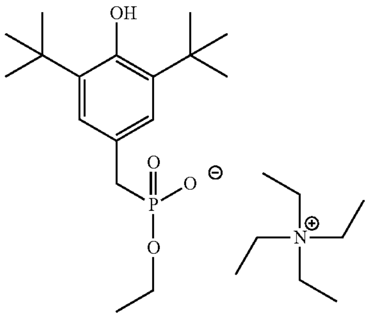
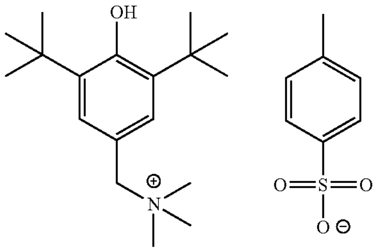
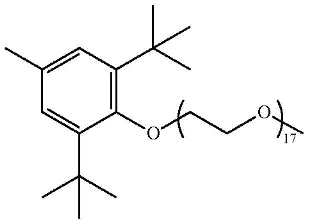
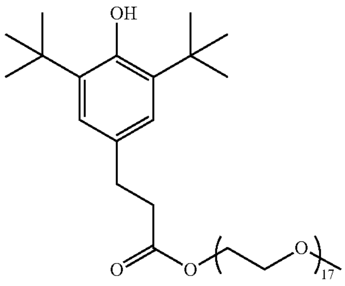
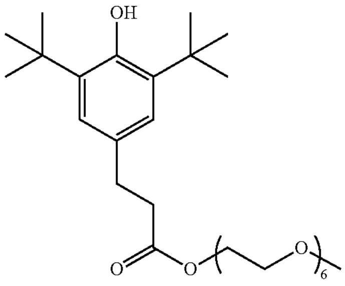
-continued
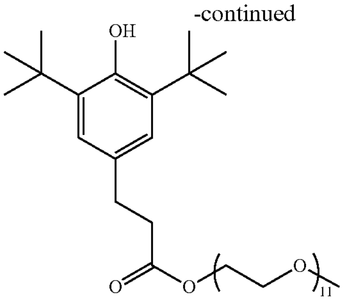
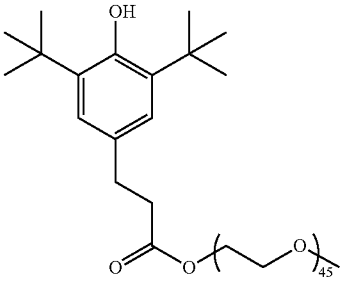
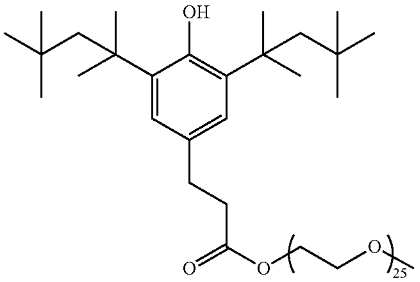
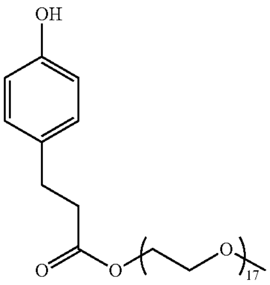
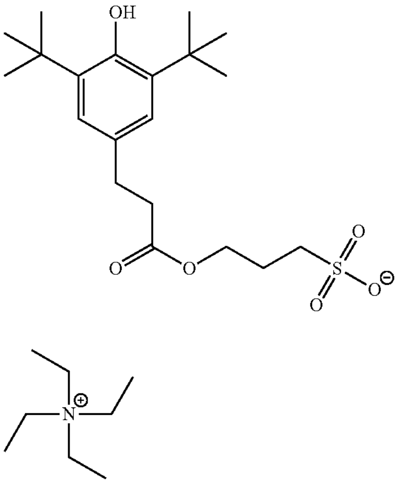

-continued

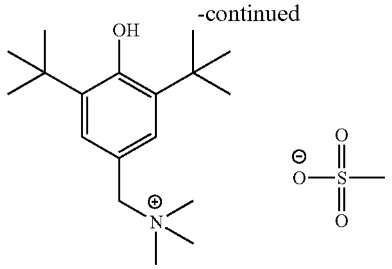

Among the compounds (1) described above, those having an HLB value of 11 to 17 are preferably used, and those having an HLB value of 12 to 16 are more preferably used. If the compound having an HLB value of equal to or greater than 11 is used, water solubility becomes excellent. Accordingly, the coating properties of the conductive film forming composition are improved, the surface of the conductive film can be made smooth, and the mobility of the organic thin film transistor tends to be further improved. If the compound having an HLB value of equal to or less than 17 is used, even after a heating step at the time of forming the conductive film, the hydrophobic portion sufficiently exists, and hence the hygroscopicity is reduced. Consequently, an organic thin film transistor having excellent insulation reliability can be obtained.

In the present invention, a Hydrophile Lipophile Balance (HLB) value can be calculated based on a Griffin method (J. Soc. CosmeticChem., 5 (1954), 294). Specifically, a molecular weight of the compound (1) is denoted by M, a molecular weight of the hydrophilic portion is denoted by Mw, and the HLB value can be calculated by the following Equation (HL).

$$\text{HLB value}=20\times Mw/M \quad \text{(HL)}$$

Among the compounds (1) described above, those having an oxidation-reduction potential of equal to or lower than 1.4 eV are preferably used, those having an oxidation-reduction potential of 0.4 eV to 1.4 eV are more preferably used, and those having an oxidation-potential of 0.6 eV to 1.4 eV are even more preferably used. If the oxidation-reduction potential is equal to or higher than 0.4 eV, during heating performed at the time of manufacturing the conductive film (electrode) of the organic thin film transistor, the loss of reducing properties caused by air oxidation can be inhibited, and hence an organic thin film transistor having excellent insulation reliability can be obtained. If the oxidation-reduction potential is equal to or lower than 1.4 eV, the migration inhibition effect is exhibited better.

In the present invention, an oxidation-reduction potential can be measured according to cyclic voltammetry by using a device equivalent to an electrochemical analyzer VMP3 (manufactured by Bio-Logic Science Instruments).

In a case where the material constituting the conductive particles is silver (Ag), when the conductive film forming composition according to the present embodiment is heated for 1 hour at 150° C., an SP value of the compound (that is, the compound (1) having undergone thermal decomposition) derived from the compound (1) is preferably equal to or less than 22 $MPa^{1/2}$, more preferably equal to or less than 21 $MPa^{1/2}$, and even more preferably 21 $MPa^{1/2}$.

If the SP value of the compound derived from the compound (1) is equal to or less than 22 $MPa^{1/2}$, the moisture absorption that occurs at the time of forming an organic thin film transistor can be reduced, and hence an organic thin film transistor having excellent insulation reliability can be prepared.

In the present invention, an SP value can be calculated based on an Okitsu method (Toshinao Okitsu, "The Journal of The Adhesion Society of Japan", 29 (3), (1993)).

The content of the compound (1) is not particularly limited, but is, with respect to 100 parts by mass of the conductive particles, preferably equal to or greater than 0.1 parts by mass to equal to or less than 30 parts by mass, more preferably equal to or greater than 1 part by mass and equal to or less than 20 parts by mass, and even more preferably equal to or greater than 1 part by mass to equal to or less than 15 parts by mass. If the content of the compound (1) is within the above range, the aforementioned effects tend to be more markedly exhibited.

The content of the compound (1) contained in the conductive film forming composition according to the present embodiment is not particularly limited, but is, with respect to the total mass (100% by mass) of the conductive film forming composition, preferably 0.1% by mass to 20% by mass, more preferably 1% by mass to 15% by mass, and even more preferably 2% by mass to 10% by mass. If the content of the compound (1) is within the above range, the aforementioned effects tend to be more markedly exhibited.

The conductive film forming composition according to the present embodiment may contain one kind of the compound (1) singly or contain two or more kinds thereof.

The migration inhibitor according to the present embodiment may contain a compound which functions to inhibit migration in addition to the compound (1), as long as the function of the compound (1) can be sufficiently exhibited.

The compound (1) can be synthesized by the method equivalent to the synthesis method known in the related art (for example, JP1996-504780A (JP-H08-504780A)).

1.1.3. Water

The conductive film forming composition according to the present embodiment contains water. Water is a component which functions as a solvent dissolving the conductive particles and vaporizes and is scattered after the formation of the conductive film.

The content of water is, with respect to the total mass (100% by mass) of the conductive film forming composition, preferably equal to or greater than 10% by mass, and more preferably equal to or greater than 10% by mass and equal to or less than 90% by mass, because then viscosity and the like can be controlled within an appropriate range, an environmental load can be reduced, or the damage of the substrate can be reduced.

1.1.4. Other Components

The conductive film forming composition according to the present embodiment may contain a solvent other than water, and for example, an organic solvent (alcohols, ethers, esters, and the like) can be used.

The conductive film forming composition according to the present embodiment may contain a known component contained in a general conductive film forming composition, such as a dispersant or a surfactant.

1.1.5. Preparation Method

The preparation method of the conductive film forming composition according to the present embodiment is not particularly limited, and known methods can be adopted. For example, by adding the aforementioned conductive particles and the compound (1) to the aforementioned solvent (water, an organic solvent, or the like) and then mixing and stirring them together by using known means such as an ultrasonic method (for example, a treatment performed using an ultrasonic homogenizer), a mixer method, a triple roll method, or a ball mill method, the conductive film forming composition according to the present embodiment can be obtained.

The conductive film forming composition according to the present embodiment is useful for forming an electrode of a field effect transistor (particularly, an organic thin film transistor). The electrode may be any of a source electrode, a drain electrode, and a gate electrode. Particularly, the conductive film forming composition of the present embodiment is useful for a source electrode and a drain electrode. Herein, the organic thin film transistor can be suitably used in electronic paper or a display device.

As described above, the compound (1) contained in the conductive film forming composition according to the present embodiment brings about excellent insulation reliability by functioning as an excellent migration inhibitor. Therefore, the conductive film forming composition according to the present embodiment is also useful as a conductive film forming composition for forming wiring of a wiring board (for example, a printed wiring board) and the like.

1.2. Organic Thin Film Transistor

An organic thin film transistor according to an embodiment of the present invention is an organic thin film transistor including electrodes (particularly, a source electrode and a drain electrode) formed using the aforementioned conductive film forming composition. The organic thin film transistor according to the present embodiment may be a bottom contact-type or a top contact-type.

An aspect of the organic thin film transistor according to the present invention will be described with reference to a drawing.

FIG. 1 is a schematic cross-sectional view of an aspect of the organic thin film transistor of the present invention. In FIG. 1, an organic thin film transistor 100 includes a substrate 10, a gate electrode 20, a gate insulating film 30, a source electrode 40, a drain electrode 42, an organic semiconductor layer 50, and a sealing layer 60. The source electrode 40 and the drain electrode 42 are formed using the aforementioned conductive film forming composition of the present invention. The organic thin film transistor 100 is a bottom contact-type organic thin film transistor.

Hereinafter, the substrate, the gate electrode, the gate insulating film, the source electrode, the drain electrode, the organic semiconductor layer, the sealing layer, and methods for forming each of these will be specifically described.

<Substrate>

The substrate plays a role of supporting the gate electrode, the source electrode, the drain electrode, and the like which will be described later.

The type of the substrate is not particularly limited, and examples thereof include a plastic substrate, a glass substrate, a ceramic substrate, and the like. Among these, from the viewpoint of the applicability to various devices, a glass substrate or a plastic substrate is preferable.

Examples of the material of the plastic substrate include a thermosetting resin (for example, an epoxy resin, a phenol resin, a polyimide resin, or a polyester resin (for example, PET or PEN)) and a thermoplastic resin (for example, a phenoxy resin, polyethersulfone, polysulfone, or polyphenylene sulfone).

Examples of the material of the ceramic substrate include alumina, aluminum nitride, zirconia, silicon, silicon nitride, silicon carbide, and the like.

Examples of the material of the glass substrate include soda glass, potash glass, borosilicate glass, quartz glass, aluminosilicate glass, lead glass, and the like.

<Gate Electrode>

Examples of the material of the gate electrode include a metal such as gold (Au), silver, aluminum (Al), copper, chromium, nickel, cobalt, titanium, platinum, magnesium, calcium, barium, or sodium; a conductive oxide such as $InO_2$, $SnO_2$, or ITO; a conductive polymer such as polyaniline, polypyrrole, polythiophene, polyacetylene, or polydiacetylene; a semiconductor such as silicon, germanium, or gallium arsenide; a carbon material such as fullerene, carbon nanotubes, or graphite; and the like. Among these, a metal is preferable, and silver or aluminum is more preferable.

The thickness of the gate electrode is not particularly limited but is preferably 20 to 200 nm.

The method for forming the gate electrode is not particularly limited. Examples of the method include a method of vacuum vapor-depositing or sputtering an electrode material onto a substrate, a method of coating a substrate with a composition for forming an electrode, a method of printing a composition for forming an electrode on a substrate, and the like. Furthermore, in a case where the electrode is patterned, examples of the patterning method include a photolithography method; a printing method such as ink jet printing, screen printing, offset printing, or relief printing; a mask vapor deposition method; and the like.

<Gate Insulating Film>

Examples of the material of the gate insulating film include a polymer such as polymethyl methacrylate, polystyrene, polyvinylphenol, polyimide, polycarbonate, polyester, polyvinylalcohol, polyvinyl acetate, polyurethane, polysulfone, polybenzoxazole, polysilsesquioxane, an epoxy resin, or a phenol resin; an oxide such as silicon dioxide, aluminum oxide, or titanium oxide; a nitride such as silicon nitride; and the like. Among these materials, in view of the compatibility with the organic semiconductor layer, a polymer is preferable.

In a case where a polymer is used as the material of the gate insulating film, it is preferable to concurrently use a cross-linking agent (for example, melamine). By the concurrent use of the cross-linking agent, the polymer is cross-linked, and the durability of the formed gate insulating film is improved.

The film thickness of the gate insulating film is not particularly limited, but is preferably 100 to 1,000 nm.

The method for forming the gate insulating film is not particularly limited, but examples thereof include a method of coating a substrate, on which the gate electrode is formed, with a composition for forming a gate insulating film, a method of vapor-depositing or sputtering the material of the gate insulating film onto the substrate on which the gate electrode is formed, and the like. The method for coating the aforementioned substrate with the composition for forming a gate insulating film is not particularly limited, and it is possible to use a known method (a bar coating method, a spin coating method, a knife coating method, or a doctor blade method).

In a case where the gate insulating film is formed by coating the substrate with the composition for forming a gate insulating film, for the purpose of removing the solvent, causing cross-linking, or the like, the composition may be heated (baked) after coating. The heating conditions at the time of forming the gate insulating film are not particularly limited, but generally, it is preferable to perform heating for 5 to 120 minutes (preferably for 5 to 60 minutes) at 30° C. to 250° C. (preferably at 80° C. to 200° C.).

<Source Electrode and Drain Electrode>

As described above, the source electrode and the drain electrode are formed using the conductive film forming composition of the present invention described above.

The channel length of the source electrode and the drain electrode is not particularly limited, but is preferably 5 to 100 μm.

The channel width of the source electrode and the drain electrode is not particularly limited, but is preferably 50 to 500 μm.

The method for forming the source electrode and the drain electrode is not particularly limited, but examples thereof include a method including a coating film forming step and a sintering step. Hereinafter, each of the steps will be described.

(Coating Film Forming Step)

This is a step of coating the substrate, on which the gate electrode and the gate insulating film are formed, with the aforementioned conductive film forming composition.

The method for forming a coating film by coating the substrate with the conductive film forming composition is not particularly limited, and known methods can be adopted.

Examples of the method of coating includes a coating method, a screen printing method, a dip coating method, a spray coating method, a spin coating method, an ink jet method, and the like using a double roll coater, a slit coater, an air knife coater, a wire bar coater, a slide hopper, a spray coater, a blade coater, a doctor coater, a squeeze coater, a reverse roll coater, a transfer roll coater, an extrusion coater, a curtain coater, a dip coater, a die coater, and a gravure roll.

After the substrate is coated with the conductive film forming composition, if necessary, in order to remove the solvent, a drying treatment may be performed. As the method of the drying treatment, the methods known in the related art can be used.

(Sintering Step)

This is a step of forming a conductive film by sintering the conductive particles in the conductive film forming composition by applying heat energy or light energy to the coating film formed by the coating film forming step by means of heating or light irradiation.

The heating conditions are not particularly limited. However, the heating temperature is preferably 100° C. to 300° C., and the heating time is more preferably 10 to 60 minutes.

The heating means is not particularly limited, and known heating means such as an oven and a hot plate can be used.

The light source used for the light irradiation treatment is not particularly limited, and examples thereof include a mercury lamp, a metal halide lamp, a xenon (Xe) lamp, a chemical lamp, a carbon arc lamp, and the like.

<Organic Semiconductor Layer>

The organic semiconductor material constituting the organic semiconductor layer is not particularly limited, and known materials used as an organic semiconductor layer of organic thin film transistors can be used. Specific examples of the organic semiconductor material include pentacenes such as 6,13-bis(triisopropylsilylethynyl)pentacene (TIPS pentacene), tetramethylpentacene, and perfluoropentacene, anthradithiophenes such as TES-ADT and diF-TES-ADT (2,8-difluoro-5,11-bis(triethylsilylethynyl)anthradithiophene), benzothienobenzothiophenes such as DPh-BTBT and Cn-BTBT, dinaphthothienothiophenes such as Cn-DNTT, dioxaanthanthrenes such as peri-xanthenoxanthene, rubrenes, fullerenes such as C60 and PCBM, phthalocyanines such as copper phthalocyanine and fluorinated copper phthalocyanine, polythiophenes such as P3RT, PQT, and P3HT, polythienothiophenes such as poly[2,5-bis(3-dodecylthiophen-2-yl)thieno[3,2-b]thiophene] (PBTTT), and the like.

The thickness of the organic semiconductor layer is not particularly limited but is preferably 10 to 200 nm.

The method for forming the organic semiconductor layer is not particularly limited. Examples of the method include a method of coating the substrate, on which the gate electrode, the gate insulating film, the source electrode, and the drain electrode are formed, with a an organic semiconductor composition obtained by dissolving an organic semiconductor material in a solvent, and the like. Specific examples of the method of coating the substrate with the organic semiconductor composition are the same as the examples of the method of coating the substrate with the composition for forming a gate insulating film. In a case where the organic semiconductor layer is formed by coating the substrate with the organic semiconductor composition, for the purpose of removing the solvent, causing crosslinking, or the like, the composition may be heated (baked) after coating. The heating conditions at the time of forming the organic semiconductor layer are not particularly limited, but generally, it is preferable to perform heating for 5 to 120 minutes (preferably for 5 to 60 minutes) at 30° C. to 200° C. (preferably at 30° C. to 120° C.).

<Sealing Layer>

From the viewpoint of durability, the organic thin film transistor of the present invention preferably includes a sealing layer as the outermost layer. For the sealing layer, a known sealant can be used.

The thickness of the sealing layer is not particularly limited but is preferably 0.2 to 10 μm.

The method for forming the sealing layer is not particularly limited. Examples of the method include a method of coating the substrate, on which the gate electrode, the gate insulating film, the source electrode, the drain electrode, and the organic semiconductor layer are formed, with a composition for forming a sealing layer, and the like. Specific examples of the method of coating the substrate with the composition for forming a sealing layer are the same as the examples of the method of coating the substrate with the composition for forming a gate insulating film. In a case where the sealing layer is formed by coating the substrate with the composition for forming a sealing layer, for the purpose of removing the solvent, causing crosslinking, or the like, the composition may be heated (baked) after coating. The heating conditions at the time of forming the sealing layer are not particularly limited, but generally, it is preferable to perform heating for 5 to 120 minutes (preferably for 5 to 60 minutes) at 30° C. to 250° C. (preferably at 80° C. to 200° C.).

Figure 2:
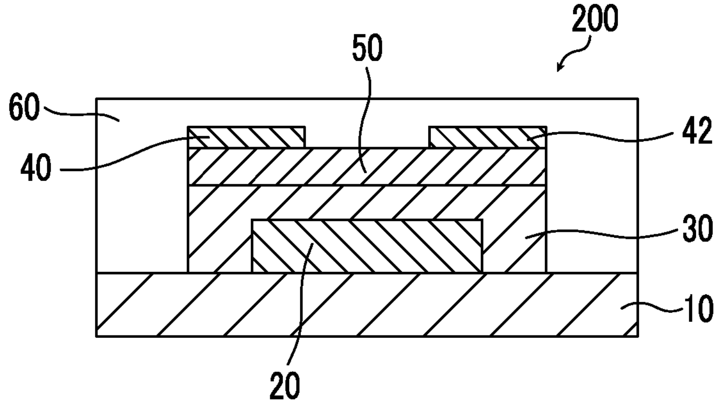
FIG. 2 is a schematic cross-sectional view of another aspect of the organic thin film transistor of the present invention.

FIG. 2 is a schematic cross-sectional view of another aspect of the organic thin film transistor of the present invention.

In FIG. 2, an organic thin film transistor 200 includes a substrate 10, a gate electrode 20, a gate insulating film 30, a source electrode 40, a drain electrode 42, an organic semiconductor layer 50, and a sealing layer 60. Herein, the source electrode 40 and the drain electrode 42 are formed using the aforementioned conductive film forming composition of the present invention. The organic thin film transistor 200 is a top contact-type organic thin film transistor.

The substrate, the gate electrode, the gate insulating film, the source electrode, the drain electrode, the organic semiconductor layer, and the sealing layer are as described above.

2. Second Embodiment

2.1. Conductive Film Forming Composition

A conductive film forming composition according to the present embodiment contains water, conductive particles, and a migration inhibitor containing a compound having a group represented by Formula (3), in which an HLB value of the compound having a group represented by Formula (3) is 11 to 17.

The conductive film forming composition according to the present embodiment (that is, the conductive film forming composition according to the second embodiment) contains, as a migration inhibitor, a compound which has a group represented by Formula (3) and has an HLB value of 11 to 17 instead of the aforementioned compound (1). In this respect, the conductive film forming composition according to the present embodiment is different from the conductive film forming composition according to the first embodiment.

Hereinafter, regarding the conductive film forming composition according to the present embodiment, the difference between the conductive film forming composition according to the present embodiment and the conductive film forming composition according to the first embodiment will be specifically described. Except for the differences, the organic semiconductor composition according to the present embodiment is the same as the organic semiconductor composition according to the first embodiment, and hence the description thereof will not be repeated. Furthermore, among the references in formulae in the present embodiment, the same references as the references in the formulae in the first embodiment have the same definition as described above, and hence the description thereof will not be repeated.

In the present specification, the compound which has a group represented by Formula (3) and has an HLB value within a range of 11 to 17 will be simply referred to as a "compound (3)" as well.

<Compound (3)>

The migration inhibitor according to the present embodiment includes a compound (compound (3)) which has a group represented by Formula (3) and has an HLB value within a range of 11 to 17.

(3)

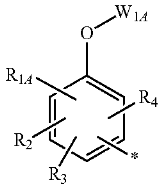

In Formula (3), $W_{1A}$ represents a group represented by Formula (1A).

In Formula (3), $R_{1A}$ represents an alkyl group having 1 to 22 carbon atoms. If $R_{1A}$ exists in the ortho-position based on the —O—$W_{1A}$ group as described above, the hydrophobicity of the compound (3) can be improved. Accordingly, the hygroscopicity of the obtained organic thin film transistor can be reduced, and the insulation reliability is improved. $R_{1A}$ represents an alkyl group having 1 to 22 carbon atoms, and more preferably represents an alkyl group having a branched structure because then the hydrophobicity can be further improved.

In Formula (3), $R_2$, $R_3$, and $R_4$ each independently represent any one of a hydrogen atom, a substituent, and $W_2$. $W_2$ represents a substituent, a group represented by Formula (D) described above, a group represented by Formula (E) described above, or a group represented by Formula (F) described above. The details of these groups are as described above in Formula (1).

In Formula (3), * represents a binding position.

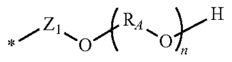

(1A)

In Formula (1A), $Z_1$ represents a divalent linking group, and the detail thereof is as described above in Formula (1). The terminal of the group represented by Formula (1A) is a hydrogen atom. Therefore, the solubility in water can be improved, and the coating properties of the conductive film forming composition can be improved.

$R_A$ represents an alkylene group having 1 to 4 carbon atoms, and the detail thereof is as described above in Formula (A).

n represents an integer of 4 to 100, and the detail thereof is as described above in Formula (A). * represents a binding position.

The compound (3) is preferably a compound represented by the following Formula (4).

$(Rx_A)_n$-L-$(Ry)_m$ (4)

In Formula (4), L represents a single bond or an (n+m)-valent linking group, and the detail thereof is as described above in Formula (2).

In Formula (4), $Rx_A$ is a group represented by the following Formula (GA). In a case where n is equal to or greater than 2, a plurality of $Rx_A$'S may be the same as or different from each other.

In Formula (4), Ry is a hydrogen atom, a substituent, or a group represented by the following Formula (H), and the definition thereof is as described above in Formula (2). In a case where m is equal to or greater than 2, a plurality of Ry's may be the same as or different from each other.

(GA)

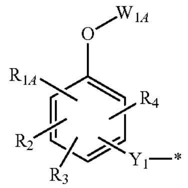

(H)

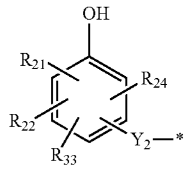

In Formula (GA), all of $W_{1A}$, $R_{1A}$, $R_2$, $R_3$, and $R_4$ have the same definition as the group represented by Formula (3). $Y_1$ represents a single bond or a divalent linking group, and the definitions thereof are as described above. * represents a binding position.

$W_{1A}$ in Formula (3) and Formula (4) described above is preferably a group represented by Formula (IA), a group represented by Formula (JA), or a group represented by Formula (KA), because then the effects of the present invention are more markedly exhibited.

(IA)

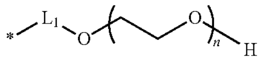

(JA)

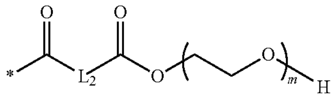

(KA)

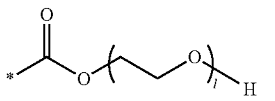

In Formulae (IA) and (JA), $L_1$ and $L_2$ each independently represent an alkylene group having 1 to 12 carbon atoms or an arylene group having 6 to 12 carbon atoms, and the detail thereof is as described above.

In Formulae (IA), (JA), and (KA), n, m, and 1 each independently represent an integer of 4 to 100, and the detail thereof is as described above.

In Formulae (IA), (JA), and (KA), * represents a binding position.

$W_2$ in Formula (3) and Formula (4) described above is preferably a group represented by Formula (M) described above, a group represented by Formula (N) described above, a group represented by Formula (O) described above, or a group represented by Formula (P) described above, because then the effects of the present invention are more markedly exhibited. The details of these groups are as described above.

The HLB value of the compound (3) is within a range of 11 to 17. If the HLB value is equal to or greater than 11, the water solubility becomes excellent. Therefore, the coating properties of the conductive film forming composition can be improved, the surface of the conductive film can be made smooth, and an organic thin film transistor having excellent mobility can be obtained. If the HLB value is equal to or less than 17, even after a heating step at the time of forming the conductive film, the hydrophobic portion sufficiently exists, and hence the hygroscopicity is reduced. Consequently, an organic thin film transistor having excellent insulation reliability can be obtained.

In contrast, if a compound which has a group represented by Formula (3) and has an HLB value of less than 11 is used, the water solubility becomes insufficient. Accordingly, the smoothness of the conductive film tends to deteriorate, or the mobility of the organic thin film transistor tends to deteriorate due to the smoothness deterioration. Furthermore, if a compound which has a group represented by Formula (3) and has an HLB value of greater than 17 is used, after the heating step at the time of forming the conductive film, the hydrophobicity becomes insufficient, and moisture absorption occurs. Consequently, the insulation reliability of the organic thin film transistor tends to deteriorate.

Specific examples of the compound (3) include compounds represented by the following formulae.

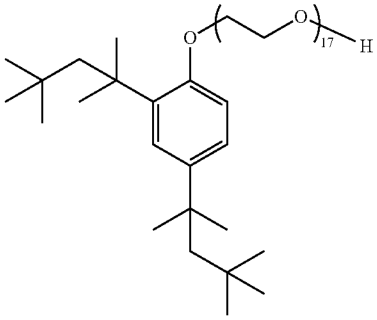

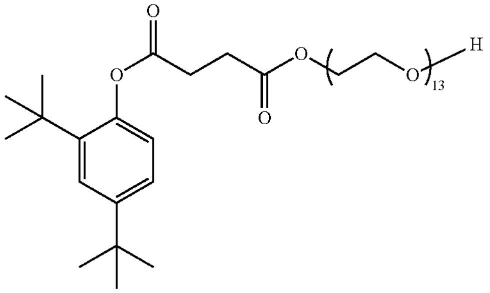

The compound (3) contained in the conductive film forming composition according to the present embodiment brings about excellent insulation reliability by functioning as an excellent migration inhibitor. Therefore, the conductive film forming composition according to the present embodiment is useful as a conductive film forming composition for forming wiring of a wiring board (for example, a printed wiring board) and the like.

2.2. Organic Thin Film Transistor

An organic thin film transistor according an embodiment of the present invention is the same as the organic thin film transistor according to the first embodiment, except that the organic thin film transistor of the present embodiment includes electrodes (particularly, a source electrode and a drain electrode) formed using the aforementioned conductive film forming composition (that is, the conductive film forming composition according to the second embodiment), and hence the description thereof will not be repeated.

EXAMPLES

Hereinafter, the present invention will be more specifically described based on examples, but the present invention is not limited to the examples.

<Preparation of Silver Ink A1>

As a dispersant, Disperbyk-190 (manufactured by BYK-Chemie GmbH) (7.36 g as a nonvolatile matter) was dissolved in water (100 mL) (solution a). Then, 50.00 g (294.3 mmol) of silver nitrate was dissolved in water (200 mL) (solution b). The solution a and the solution b were mixed and stirred together, thereby obtaining a mixture. To the mixture obtained in this way, 85% by mass aqueous N,N-diethylhydroxylamine solution (78.71 g) (750.5 mmol as N,N-diethylhydroxylamine) was slowly added dropwise at room temperature. Thereafter, a solution obtained by dissolving Disperbyk-190 (7.36 g) in water (1,000 mL) was slowly added dropwise thereto at room temperature. Through an ultrafiltration unit (Vivaflow 50 manufactured by Sartorius Stedim Biotech, molecular weight cut-off: 100,000, number of units: 4), the obtained suspension was purified by passing purified water through the unit until approximately 5 L of leachate was obtained from the ultrafiltration unit. The supply of the purified water was stopped, and concentration was performed, thereby obtaining 50 g of silver nanoparticle dispersion (silver ink A1). The content of solids in the silver ink A1 was 32% by mass. Furthermore, as a result of measuring the content of silver in the solids by TG-DTA, it was confirmed that the content of silver was 97.0% by mass.

Examples 1 to 18 and Comparative Examples 1 and 2

The migration inhibitor of the type shown in Table 1 was added in the formulation amount shown in Table 1 to the silver ink A1 obtained as above, thereby preparing silver inks A2 to A19 (conductive film forming compositions of Examples 1 to 18) and silver inks A20 to A23 (conductive film forming compositions of Comparative Examples 1 to 4).

In Table 1, "Content of migration inhibitor" means the content (part by mass) of the migration inhibitor with respect to 100 parts by mass of silver nanoparticles. Furthermore, in Table 1, "Content of water" means the content (% by mass) of water with respect to the total amount (100% by mass) of the silver ink.

The chemical structures of the migration inhibitors in Table 1 are as below.

The migration inhibitor M-12 is NEWCOL 560 (trade name, Nippon Nyukazai Co., Ltd.), the migration inhibitor M-13 is NEWCOL 504 (trade name, Nippon Nyukazai Co., Ltd.), the migration inhibitor M-18 is DL-α tocopherol (manufactured by TOKYO CHEMICAL INDUSTRY CO., LTD.), and the migration inhibitor M-19 is IRGANOX 245 (trade name, manufactured by BASF SE).

The HLB values of the migration inhibitors M-1 to M-14 and M-19 are summarized in Table 1. The HLB values were calculated based on the aforementioned equation (HL).

The migration inhibitors M-1 to M-11, M-14 to M-17, M-20, and M-21 were synthesized as below.

M-1

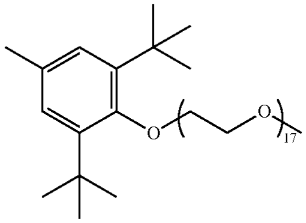

M-2

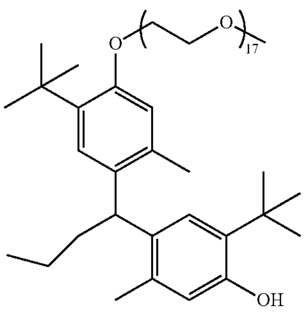

-continued

M-3

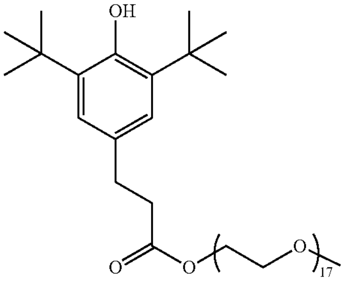

M-4

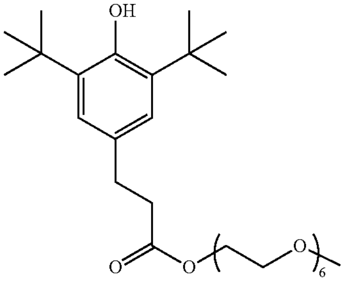

M-5

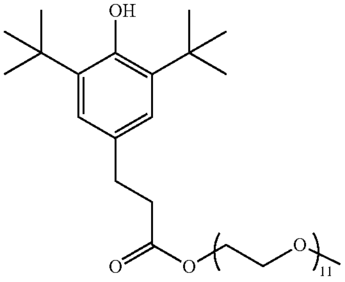

M-6

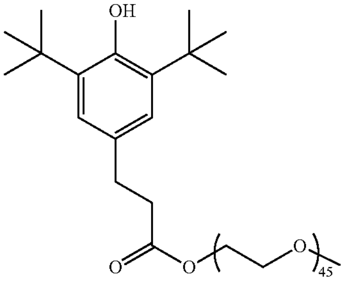

M-7

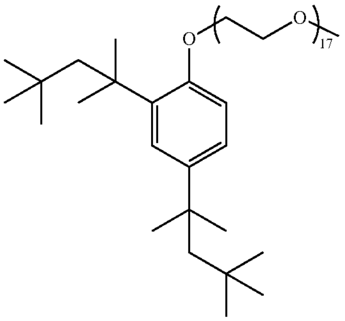

-continued
M-8
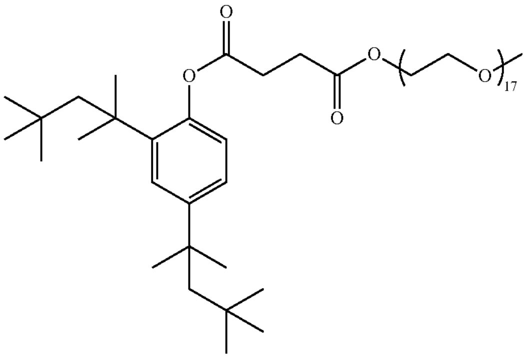
M-9
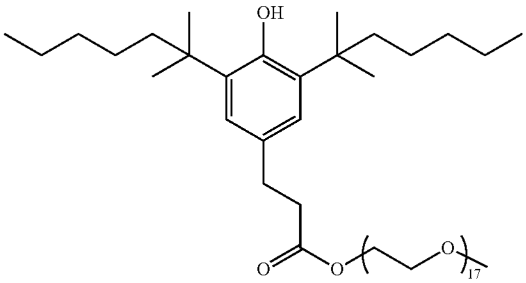
M-10
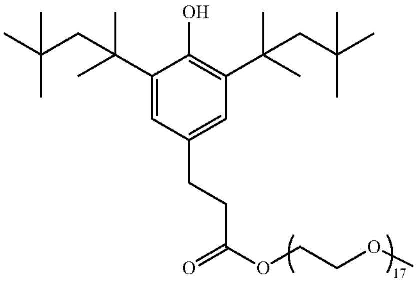
M-11
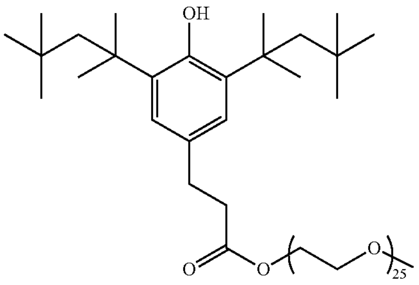
M-12
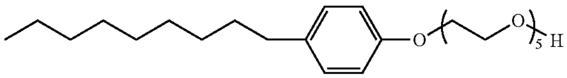
M-13
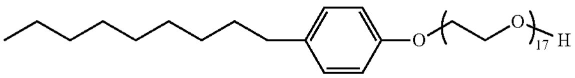
-continued
M-14
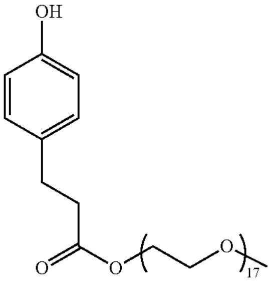
M-15
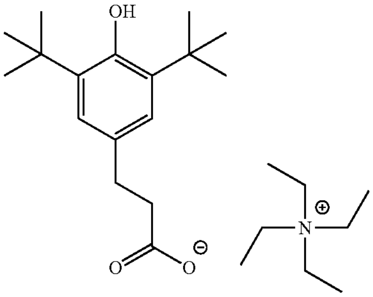
M-16
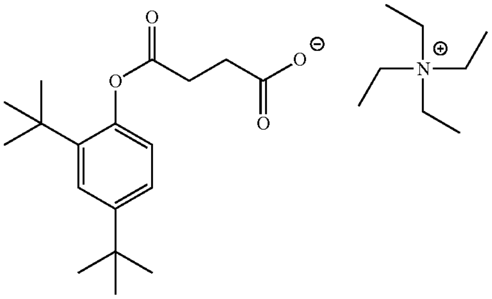
M-17
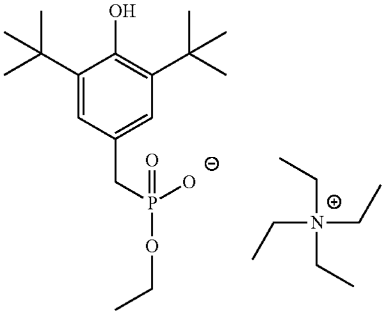
M-18
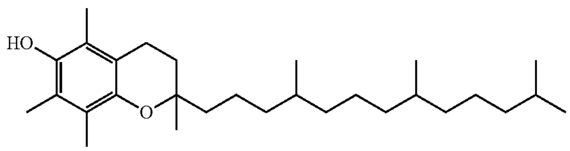

-continued

M-19

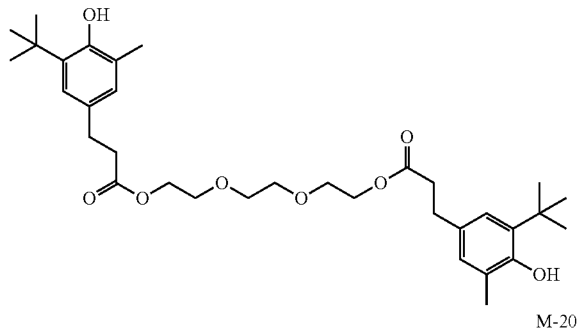

M-20

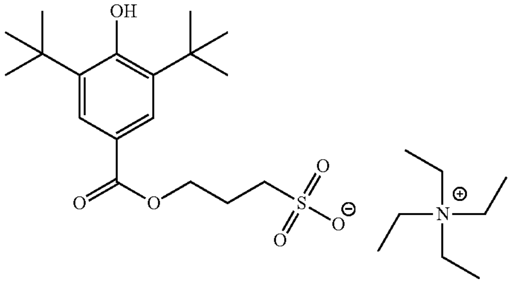

M-21

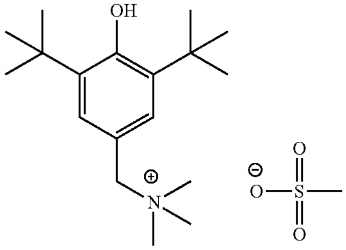

Synthesis Example 1: Migration Inhibitor M-1

Polyethylene glycol monomethyl ether: average molecular weight of 750, manufactured by FLUKA (50 g, 66.7 mmol), p-toluenesulfonylchloride (19 g, 100 mmol), and dichloromethane (150 ml) were put into a reaction container, and triethylamine (13.5 g, 133 mmol) was added thereto under ice cooling, followed by stirring for 4 hours at 40° C. After the reaction solution was concentrated under a reduced pressure, 100 ml of acetone and 100 ml of saturated sodium hydrogen carbonate were added thereto, followed by stirring for 1 hour at 60° C. Then, the solution was cooled to room temperature and subjected to extraction using 200 ml of dichloromethane. The organic phase was washed with saturated saline and then dried over magnesium sulfate. The solid content was separated by filtration, and then the solution was concentrated under a reduced pressure, thereby obtaining 45 g of a compound A-1 (yield: 72%).

Compound A-1

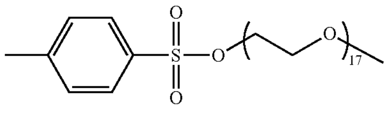

2,6-Di-tert-butyl-4-methylphenol (3.66 g, 16.6 mmol) and 20 ml of tetrahydrofuran were put into a reaction container, sodium hydride (0.40 g, 16.6 mmol) was added thereto in a nitrogen stream under ice cooling, followed by stirring for 30 minutes. The compound A-1 (5.0 g, 5.5 mmol) was added thereto, followed by stirring for 12 hours at 60° C. After the reaction was finished, the solution was cooled to room temperature, 50 ml of water was added thereto, and extraction was performed using 100 ml of ethyl acetate. The organic phase was washed with saturated saline and dried over magnesium sulfate. The solid content was separated by filtration, and then the solution was concentrated under a reduced pressure and purified by silica gel column chromatography (mobile phase: methanol/ethyl acetate), thereby obtaining 3 g of a compound M-1 (migration inhibitor M-1) (yield: 55%).

Synthesis Example 2: Migration Inhibitor M-2

4,4'-Butylidenebis(6-tert-butyl-m-cresol) (5.07 g, 13.2 mmol) and 20 ml of tetrahydrofuran were put into a reaction container, sodium hydride (0.32 g, 13.2 mmol) was added thereto in a nitrogen stream under ice cooling, followed by stirring for 30 minutes. The compound A-1 (3.0 g, 3.3 mmol) was added thereto, followed by stirring for 12 hours at 60° C. After the reaction was finished, the solution was cooled to room temperature, 50 ml of water was added thereto, and extraction was performed using 100 ml of ethyl acetate. The organic phase was washed with saturated saline and dried over magnesium sulfate. The solid content was separated by filtration, and then the solution was concentrated under a reduced pressure and purified by silica gel column chromatography (mobile phase: methanol/ethyl acetate), thereby obtaining 1.5 g of a compound M-2 (migration inhibitor M-2) (yield: 40%).

Synthesis Example 3: Migration Inhibitor M-3

3-(3,5-Di-tert-butyl-4-hydroxyphenyl)propionate (5.0 g, 18.0 mmol), polyethylene glycol monomethyl ether: average molecular weight of 750, manufactured by FLUKA (13.47 g, 18.0 mmol), dichloromethane (20 ml), and tetrahydrofuran (10 ml) were put into a reaction container, and 1-ethyl-3-(3-dimethylaminopropyl)carbodiimide hydrochloride (3.62 g, 18.9 mmol) and 4-dimethylaminopyridine (0.07 g, 0.54 mmol) were added thereto, followed by stirring for 30 minutes. The reaction solution was stirred for 3 hours at room temperature and then concentrated under a reduced pressure, thereby obtaining a crude product. The obtained crude product was purified by silica gel column chromatography (mobile phase: methanol/ethyl acetate), thereby obtaining 11 g of a compound M-3 (migration inhibitor M-3) (yield: 59%).

Synthesis Example 4: Migration Inhibitor M-4

M-4 (migration inhibitor M-4) was synthesized by the same method as in Synthesis Example 3, except that polyethylene glycol monomethyl ether having an average molecular weight of 350 and manufactured by FLUKA (6.29 g, 27.5 mmol) was used instead of polyethylene glycol monomethyl ether having an average molecular weight of 750 and manufactured by FLUKA.

Synthesis Example 5: Migration Inhibitor M-5

M-5 (migration inhibitor M-5) was synthesized by the same method as in Synthesis Example 3, except that polyethylene glycol monomethyl ether having an average molecular weight of 500 and manufactured by FLUKA (9.88 g, 27.5 mmol) was used instead of polyethylene glycol monomethyl ether having an average molecular weight of 750 and manufactured by FLUKA.

Synthesis Example 6: Migration Inhibitor M-6

M-6 (migration inhibitor M-6) was synthesized by the same method as in Synthesis Example 3, except that polyethylene glycol monomethyl ether having an average molecular weight of 2,000 and manufactured by FLUKA (35.92 g, 27.5 mmol) was used instead of polyethylene glycol monomethyl ether having an average molecular weight of 750 and manufactured by FLUKA.

Synthesis Example 7: Migration Inhibitor M-7

4-tert-Octylphenol (10.0 g, 48.5 mmol), 2,4,4-trimethyl-1-pentene (21.75 g, 194 mmol), and dichloromethane (100 ml) were put into a reaction container, and 5 ml of methanesulfonic acid was added thereto under ice cooling, followed by stirring for 30 minutes. The reaction solution was further stirred for 12 hours at room temperature, and then 100 ml of water was added thereto, followed by extraction by using 300 ml of ethyl acetate. The organic phase was washed with saturated saline and dried over magnesium sulfate. The solid content was separated by filtration, and then the solution was concentrated under a reduced pressure and purified by silica gel column chromatography (mobile phase: chloroform/ethyl acetate), thereby obtaining 10 g of a compound A-2 (yield: 65%).

A-2

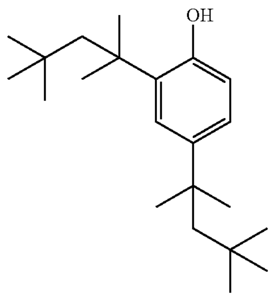

The compound A-2 (2.11 g, 6.6 mmol) and 20 ml of tetrahydrofuran were put into a reaction container, and sodium hydride (0.16 g, 6.6 mmol) was added thereto in a nitrogen stream under ice cooling, followed by stirring for 30 minutes. The compound A-1 (5.0 g, 5.5 mmol) was added thereto, followed by stirring for 4 hours at 60° C. After the reaction was finished, the solution was cooled to room temperature, and 50 ml of water was added thereto, followed by extraction by using 100 ml of ethyl acetate. The organic phase was washed with saturated saline and dried over magnesium sulfate. The solid content was separated by filtration, and then the solution was concentrated under a reduced pressure and purified by silica gel column chromatography (mobile phase: methanol/ethyl acetate), thereby obtaining 4 g of a compound M-7 (migration inhibitor M-7) (yield: 69%).

Synthesis Example 8: Migration Inhibitor M-8

The compound A-2 (4.0 g, 12.6 mmol), succinic anhydride (2.51 g, 25.1 mmol), 4-dimethylaminopyridine (0.08 g, 0.63 mmol), and 20 ml of pyridine were put into a reaction container, followed by stirring for 4 hours at 60° C. After the reaction was finished, the reaction solution was cooled to room temperature, 100 ml of 1 N HCl solution was added thereto, followed by extraction by using 100 ml of ethyl acetate. The organic phase was washed with saturated saline and dried over magnesium sulfate. The solid content was separated by filtration, and then the solution was concentrated under a reduced pressure and purified by silica gel column chromatography (mobile phase: hexane/ethyl acetate), thereby obtaining 3 g of a compound A-3 (yield: 57%).

A-3

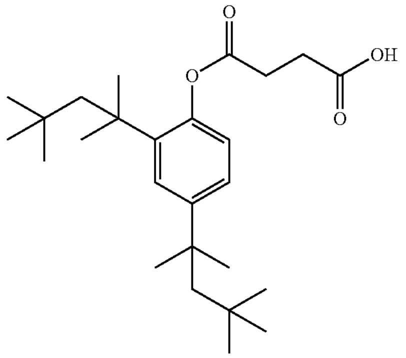

A-3 (2.0 g, 4.8 mmol), polyethylene glycol monomethyl ether: average molecular weight of 750, manufactured by FLUKA (3.58 g, 4.8 mmol), dichloromethane (10 ml), and tetrahydrofuran (10 ml) were put into a reaction container, 1-ethyl-3-(3-dimethylaminopropyl)carbodiimide hydrochloride (0.96 g, 5.02 mmol) and 4-dimethylaminopyridine (0.02 g, 0.14 mmol) were added thereto under ice cooling, followed by stirring for 30 minutes. The reaction solution was further stirred for 3 hours at room temperature and then concentrated under a reduced pressure, thereby obtaining a crude product. The obtained crude product was purified by silica gel column chromatography (mobile phase: methanol/ethyl acetate), thereby obtaining 3 g of a compound M-8 (migration inhibitor M-8) (yield: 53%).

Synthesis Example 9: Migration Inhibitor M-9

3-(4-Hydroxyphenyl) propionate (4.0 g, 24.1 mmol), 2-methyl-2-heptanol (12.54 g, 96.3 mmol), and dichloromethane (25 ml) were put into a reaction container, and sulfuric acid (7.1 g, 72.2 mmol) was added thereto under ice cooling, followed by stirring for 30 minutes. The reaction solution was further stirred for 6 hours at room temperature, 100 ml of water was then added thereto, and extraction was performed using 200 ml of ethyl acetate. The organic phase was washed with saturated saline and dried over magnesium sulfate. The solid content was separated by filtration, and then the solution was concentrated under a reduced pressure and purified by silica gel column chromatography (mobile phase: chloroform/ethyl acetate), thereby obtaining 3 g of a compound A-4 (yield: 32%).

A-4

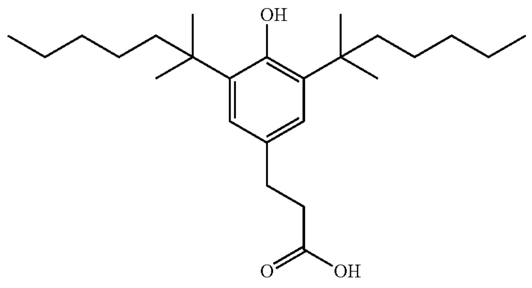

A-4 (3.0 g, 7.7 mmol), polyethylene glycol monomethyl ether: average molecular weight of 750, manufactured by FLUKA (5.76 g, 7.7 mmol), dichloromethane (20 ml), and tetrahydrofuran (10 ml) were put into a reaction container, 1-ethyl-3-(3-dimethylaminopropyl)carbodiimide hydrochloride (1.55 g, 8.07 mmol) and 4-dimethylaminopyridine (0.03 g, 0.23 mmol) were added thereto under ice cooling, followed by stirring for 30 minutes. The reaction solution was further stirred for 3 hours at room temperature and then concentrated under a reduced pressure, thereby obtaining a crude product. The obtained crude product was purified by silica gel column chromatography (mobile phase: methanol/ethyl acetate), thereby obtaining 4 g of a compound M-9 (migration inhibitor M-9) (yield: 44%).

Synthesis Example 10: Migration Inhibitor M-10

A compound M-10 (migration inhibitor M-10) was synthesized by the same method as in Synthesis Example 9, except that 2,4,4-trimethyl-2-pentanol was used instead of 2-methyl-2-heptanol.

Synthesis Example 11: Migration Inhibitor M-11

A compound M-11 (migration inhibitor M-11) was synthesized by the same method as in Synthesis Example 9, except that 2,4,4-trimethyl-2-pentanol was used instead of 2-methyl-2-heptanol, and polyethylene glycol monomethyl ether having an average molecular weight of 1,100 and manufactured by FLUKA was used instead of polyethylene glycol monomethyl ether having an average molecular weight of 750 and manufactured by FLUKA.

Synthesis Example 12: Migration Inhibitor M-14

3-(4-Hydroxyphenyl)propionate (3.0 g, 18 mmol), polyethylene glycol monomethyl ether: average molecular weight of 750, manufactured by FLUKA (13.54 g, 18 mmol), triphenylphosphine (7.1 g, 27 mmol), and tetrahydrofuran (400 ml) were put into a reaction container, and diisopropyl azodicarboxylate: 1.9 mol/L toluene solution (14.3 ml, 27 mmol) was added thereto under ice cooling, followed by stirring for 30 minutes. The reaction solution was further stirred for 3 hours at room temperature and then concentrated under a reduced pressure, thereby obtaining a crude product. The obtained crude product was purified by silica gel column chromatography (mobile phase: methanol/ethyl acetate) thereby obtaining 10 g of a compound M-14 (migration inhibitor M-14) (yield: 60%).

Synthesis Example 13: Migration Inhibitor M-15

3-(3,5-Di-tert-butyl-4-hydroxyphenyl)propionate (5.0 g, 18.0 mmol) and methanol (10 ml) were put into a reaction container, and tetraethylammonium hydroxide (2.64 g, 18 mmol) was added thereto under ice cooling, followed by stirring for 30 minutes. The reaction solution was further stirred for 3 hours at room temperature and then concentrated under a reduced pressure, thereby obtaining a crude product. The obtained crude product was washed with ethyl acetate and dried, thereby obtaining 6.6 g of a compound M-15 (migration inhibitor M-15) (yield: 90%).

Synthesis Example 14: Migration Inhibitor M-16

A compound M-16 (migration inhibitor M-16) was synthesized by the same method as in Synthesis Example 13, except that a compound A-5 was used instead of 3-(3,5-di-tert-butyl-4-hydroxyphenyl)propionate. The compound A-5 was synthesized by the same method as used for synthesizing the compound A-3.

A-5

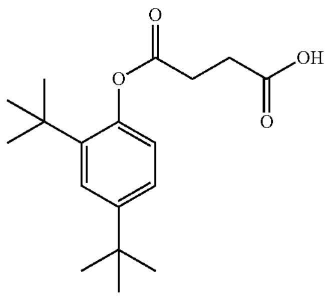

Synthesis Example 15: Migration Inhibitor M-17

A compound M-17 (migration inhibitor M-17) was synthesized by the same method as in Synthesis Example 13, except that monoethyl 3,5-di-tert-butyl-4-hydroxybenzyl phosphonate was used instead of 3-(3,5-di-tert-butyl-4-hydroxyphenyl)propionate.

Synthesis Example 16: Migration Inhibitor M-20

A compound M-20 (migration inhibitor M-20) was synthesized by the same method as in Synthesis Example 13, except that a compound A-6 was used instead of 3-(3,5-di-tert-butyl-4-hydroxyphenyl)propionate.

A-6

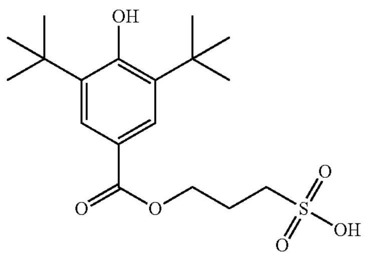

The compound A-6 was synthesized by the following method. First, 3-(3,5-di-tert-butyl-4-hydroxyphenyl)propionate (5.0 g, 18.0 mmol), 1,3-propanesultone (2.19 g, 18.0 mmol), potassium carbonate (2.98 g, 21.6 mmol), and tetrahydrofuran (20 ml) were put into a reaction container, followed by stirring for 4 hours at 60° C. After the reaction was finished, the reaction solution was cooled to room temperature, 50 ml of 1N HCl was added thereto, and extraction was performed using 100 ml of ethyl acetate. The organic phase was washed with saturated saline and dried over magnesium sulfate. The solid content was separated by filtration, and then the solution was concentrated under a reduced pressure and purified by silica gel column chromatography (mobile phase: methanol/ethyl acetate), thereby obtaining 5 g of the compound A-6 (yield: 75%).

Synthesis Example 17: Migration Inhibitor M-21

2,6-Di-tert-butyl-4-dimethylaminomethylphenol (5.0 g, 19 mmol) and tetrahydrofuran (50 ml) were put into a reaction container, and methyl methanesulfonate (2.3 g, 20.7 mmol) was added thereto under ice cooling, followed by stirring for 30 minutes. The reaction solution was further stirred for 2 hours at 50° C. and then allowed to stand for 30 minutes under ice cooling. The precipitated crystal was filtered, washed with ethyl acetate, and then dried under a reduced pressure, thereby obtaining 6 g of a compound M-21 (migration inhibitor M-21) (yield: 85%).

Preparation of Organic Thin Film Transistor

A1 which will become a gate electrode was vapor-deposited (thickness: 50 nm) onto a glass substrate (Eagle XG: manufactured by Corning Incorporated). The A1 layer was spin-coated with a composition for a gate insulating film (a propylene glycol monomethyl ether acetate (PGMEA) solution (solution concentration: 2% by mass) of polyvinylphenol/melamine=1 part by mass/1 part by mass (w/w)), and the composition was baked for 60 minutes at a temperature of 150° C., thereby forming a gate insulating film having a film thickness of 300 nm. On the gate insulating film, the shape of a source electrode and the shape of a drain electrode having a channel length of 40 m and a channel width of 250 μm were drawn by using the silver ink A1 and an ink jet device DMP-2831 (manufactured by FUJIFILM Dimatix, Inc.: using 1 pL head). Then, the ink was sintered by being baked for 30 minutes at 180° C. in an oven, thereby manufacturing a source electrode and a drain electrode. The source electrode and the drain electrode were spin-coated with an organic semiconductor composition prepared by dissolving an organic semiconductor material (5,11-bis(triethylsilylethynyl)antradithiophene (TES-ADT) (manufactured by Sigma-Aldrich Co. LLC.)) in toluene (concentration of organic semiconductor material: 2% by mass), thereby forming an organic semiconductor layer having a thickness of 100 nm. The organic semiconductor layer was spin-coated with Cytop CTL-107MK (manufactured by AGC Chemicals), and the Cytop CTL-107MK was baked for 20 minutes at 140° C., thereby forming a sealing layer (uppermost layer) having a thickness of 1 m. In this way, an organic thin film transistor (bottom contact-bottom gate type) was obtained.

<Evaluation of Mobility>

The electrodes of the obtained organic thin film transistor were respectively connected to the terminals of a manual prober connected to a semiconductor parameter•analyzer (4155C, manufactured by Agilent Technologies Inc.), thereby evaluating the field effect transistor (FET). Specifically, by measuring the drain current-gate voltage (Id-Vg) characteristics, the field effect mobility ([$cm^2$/V-sec]) was calculated. In this way, the average of the field effect mobility of five organic thin film transistors, in which the silver ink A1 was used for the source electrode and the drain electrode, was denoted by μl.

Then, by using the silver inks A2 to A23 (conductive film forming compositions of examples and comparative examples) to which the migration inhibitor was added, organic thin film transistors were prepared in the same manner as in the case where the silver ink A1 was used, and the average of the field effect mobility thereof was calculated. The average of the field effect mobility in a case where a silver ink An (n=2 to 23) was used was denoted by μn.

For the silver inks A2 to A23 (conductive film forming compositions of examples and comparative examples), μn/μl was calculated, and the mobility was evaluated according to the following standards. The results are shown in Table 1. For practical use, from the viewpoint of mobility, the organic thin film transistor is preferably evaluated to be A to C, more preferably evaluated to be A or B, and even more preferably evaluated to be A.

"A": μn/μl≥0.8

"B": 0.8≥μn/μl≥0.5

"C": 0.5≥μn/μl≥0.1

"D": 0.1≥μn/μl

<Evaluation of Insulation Reliability>

The durability of the organic thin film transistor obtained using the silver ink A1 as described above was tested according to the following method. First, the temperature organic thin film transistor was installed in a thermostatic and humidistatic tank with a temperature of 50° C. and a humidity of 50%, and voltages of Vs=−20 V, Vd=0 V, and Vg=−20 V were applied thereto. In the meantime, the transistor characteristics were measured every 10 minutes, and a time taken for a threshold voltage Vth was found to shift by equal to or higher than 10 V from the initial value was calculated as a service-life time (T1) of the transistor.

Then, by using the silver inks A2 to A23 (conductive film forming compositions of examples and comparative examples) to which a migration inhibitor was added, organic thin film transistors were prepared in the same manner as in the case where the silver ink A1 was used. Thereafter, in the same manner as used for determining T1, a service-life time (Tn) of the transistor using a silver ink An (n=2 to 23) was calculated.

From the calculated T10 and Tn, Tn/T1 was calculated, and the insulation reliability was evaluated according to the following standards. The results are shown in Table 1. From the viewpoint of insulation reliability, the organic thin film transistor is preferably evaluated to be A to C, more preferably evaluated to be A or B, and even more preferably evaluated to be A.

"A": Tn/T1≥10

"B": 10>Tn/T1≥5

"C": 5>Tn/T1≥1.5

"D": 1.5>Tn/T1

<Evaluation of Surface Condition>

A1 which will become a gate electrode was vapor-deposited (thickness: 50 nm) onto a glass substrate (Eagle XG: manufactured by Corning Incorporated). The A1 layer was spin-coated with a composition for a gate insulating film (a propylene glycol monomethyl ether acetate (PGMEA) solution (solution concentration: 2% by mass) of polyvinylphenol/melamine=1 part by mass/1 part by mass (w/w)), and the composition was baked for 60 minutes at a temperature of 150° C., thereby forming a gate insulating film having a film thickness of 300 nm. The gate insulating film was coated with each of the silver inks A2 to A23 by a spray coating method by using STS-200 (manufactured by YD Mechatro Solutions, Inc.) such that the film thickness after sintering became 200 nm. Then, the silver ink was sintered (180° C., 30 minutes) using an oven, thereby forming a silver film on the substrate. The surface condition of the prepared substrate with the silver film was visually observed.

The surface condition was evaluated into the following 4 levels. The results are shown in Table 1.

"A": The surface had a metal gloss and was smooth.

"B": The surface had a metal gloss but was not smooth.

"C": The surface substantially did not have a metal gloss and had irregularities and air bubbles.

"D": The surface did not have a metal gloss and did not show a change even after heating.

in a case where the conductive film forming composition containing the compound having a group represented by Formula (1) as a migration inhibitor was used, the insulation reliability and the mobility of the organic thin film transistor prepared using the composition were excellent (Examples 1 to 18).

Through the comparison between Example 3 (migration inhibitor M-3) and Example 14 (migration inhibitor M-15), it was understood that, in a case where a compound having an alkyleneoxy group was used as a migration inhibitor (Example 3), the mobility or the surface condition became better than in a case where a compound having an ionic group was used (Example 14).

TABLE 1

| | Example 1 | Example 2 | Example 3 | Example 4 | Example 5 | Example 6 | Example 7 | Example 8 |
|---|---|---|---|---|---|---|---|---|
| Silver ink | A2 | A3 | A4 | A5 | A6 | A7 | A8 | A9 |
| Migration inhibitor | M-1 | M-2 | M-3 | M-4 | M-5 | M-5 | M-6 | M-7 |
| HLB value of migration inhibitor | 15.9 | 13.6 | 15.0 | 10.6 | 13.3 | 13.3 | 17.7 | 14.4 |
| Content of migration inhibitor (part by mass) | 5 | 5 | 5 | 5 | 5 | 10 | 5 | 5 |
| Content of water (% by mass) | 35 | 35 | 35 | 35 | 35 | 35 | 35 | 35 |
| Evaluation result Insulation reliability | B | B | B | B | B | A | C | A |
| Mobility | A | A | A | B | A | A | A | A |
| Surface condition | A | A | A | B | A | A | A | A |

| | Example 9 | Example 10 | Example 11 | Example 12 | Example 13 | Example 14 | Example 15 | Example 16 |
|---|---|---|---|---|---|---|---|---|
| Silver ink | A10 | A11 | A12 | A13 | A14 | A15 | A16 | A17 |
| Migration inhibitor | M-8 | M-9 | M-10 | M-11 | M-14 | M-15 | M-16 | M-17 |
| HLB value of migration inhibitor | 13.2 | 14.4 | 14.4 | 15.8 | 16.8 | — | — | — |
| Content of migration inhibitor (part by mass) | 5 | 5 | 5 | 5 | 5 | 5 | 5 | 5 |
| Content of water (% by mass) | 35 | 35 | 35 | 35 | 35 | 35 | 35 | 35 |
| Evaluation result Insulation reliability | A | A | A | A | C | B | B | B |
| Mobility | A | A | A | A | A | B | B | B |
| Surface condition | A | A | A | A | A | B | B | B |

| | Example 17 | Example 18 | Comparative Example 1 | Comparative Example 2 | Comparative Example 3 | Comparative Example 4 |
|---|---|---|---|---|---|---|
| Silver ink | A18 | A19 | A20 | A21 | A22 | A23 |
| Migration inhibitor | M-20 | M-21 | M-18 | M-19 | M-12 | M-13 |
| HLB value of migration inhibitor | — | — | — | 5.1 | 10.8 | 15.8 |
| Content of migration inhibitor (part by mass) | 5 | 5 | 5 | 5 | 5 | 5 |
| Content of water (% by mass) | 35 | 35 | 35 | 35 | 35 | 35 |
| Evaluation result Insulation reliability | C | C | D | C | C | D |
| Mobility | B | B | C | D | C | B |
| Surface condition | B | B | C | D | C | B |

As shown in Table 1, it was understood that, in a case where the conductive film forming composition containing the compound having a group represented by Formula (1) as a migration inhibitor was used, the surface condition of the conductive film prepared using the composition was excellent (Examples 1 to 18). Furthermore, it was understood that, Through the comparison between Example 3 (migration inhibitor M-3) and Example 4 (migration inhibitor M-4), it was revealed that as the number of repeating units of an alkyleneoxy group increased, the surface condition of the conductive film was improved, and the mobility of the organic thin film transistor was improved. Presumably, due to the improvement of water solubility of the migration inhibitor, the surface condition of the conductive film may be improved, the crystal growth or the like of the semiconductor layer may be improved, and hence the mobility may be improved as above.

Through the comparison between Example 3 (migration inhibitor M-3) and Example 7 (migration inhibitor M-6), it was revealed that, as the number of repeating units of an alkyleneoxy group decreased, the insulation reliability was improved. Presumably, the hygroscopic action of the formed organic thin film transistor may be inhibited, and hence the insulation reliability may be improved as above.

Through the comparison between Example 1 (migration inhibitor M-1) and Example 8 (migration inhibitor M-7), it was understood that, in a case where the balance between a hydrophilic group and a hydrophobic group was excellent (Example 8), all of the surface condition, the insulation reliability, and the mobility were evaluated to be excellent.

In contrast, it was revealed that, in a case where a conductive film forming composition not containing the compound having a group represented by Formula (1) as a migration inhibitor was used, at least one of the surface condition of the conductive film, the insulation reliability of the organic thin film transistor, and the mobility of the organic thin film transistor deteriorated (Comparative Examples 1 to 4).

EXPLANATION OF REFERENCES

10: substrate
20: gate electrode
30: gate insulating film
40: source electrode
42: drain electrode
50: organic semiconductor layer
60: sealing layer
100, 200: organic thin film transistor

What is claimed is:

1. A conductive film forming composition comprising:

water;

conductive particles; and a migration inhibitor containing a compound represented by Formula (2), $$(Rx)_n\text{-L-}(Ry)_m \qquad (2)$$

in Formula (2), L represents a single bond or an (n+m)-valent linking group; in a case where L is a single bond, n=1, and m=1; and in a case where L is an (n+m)-valent linking group, n and m are an integer and satisfy $1 \le n \le 6.0 \le m \le 5$, and $2 \le n+m \le 6$, in Formula (2), Rx is a group represented by the following Formula (G); and in a case where n is equal to or greater than 2, a plurality of Rx's may be the same as or different from each other, in Formula (2), Ry is a hydrogen atom, a substituent, or a group represented by the following Formula (H); and in a case where m is equal to or greater than 2, a plurality of Ry's may be the same as or different from each other, (G)

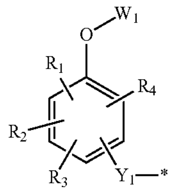

-continued (H)

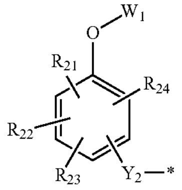

in Formula (G), $W_1$ represents a hydrogen atom, a group represented by Formula (A), a group represented by Formula (B), or a group represented by Formula (C), (A)

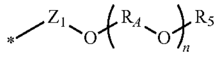

(B)

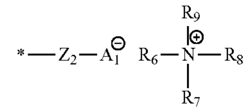

(C)

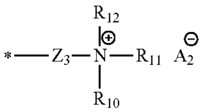

in Formula (A), $Z_1$ represents a divalent linking group; $R_A$ represents an alkylene group having 1 to 4 carbon atoms; $R_5$ represents an alkyl group having 1 to 12 carbon atoms or an aryl group having 6 to 12 carbon atoms; n represents an integer of 4 to 100; and * represents a binding position, in Formula (B), $Z_2$ represents a divalent linking group; $A_1^-$ represents an anionic group; $R_6$, $R_7$, $R_8$, and $R_9$ each independently represent a hydrogen atom, an alkyl group having 1 to 12 carbon atoms, or an aryl group having 6 to 12 carbon atoms; and * represents a binding position, in Formula (C), $Z_3$ represents a divalent linking group; $A_2^-$ represents a monovalent anion; $R_{10}$, $R_{11}$, and $R_{12}$ each independently represent a hydrogen atom, an alkyl group having 1 to 12 carbon atoms, or an aryl group having 6 to 12 carbon atoms; and * represents a binding position, in Formula (G), $R_1$, $R_2$, $R_3$, and $R_4$ each independently represent any one of a hydrogen atom, a substituent, and $W_2$; $W_2$ represents a group represented by Formula (D), a group represented by Formula (E), or a group represented by Formula (F); and in a case where $W_1$ is a hydrogen atom, at least one of $R_1$, $R_2$, $R_3$, or $R_4$ is $W_2$, (D)

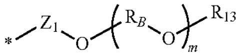

(E)

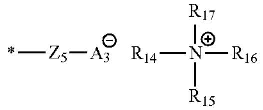

-continued (F)

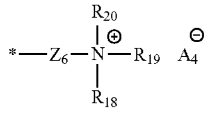

in Formula (D), $Z_4$ represents a single bond or a divalent linking group; $R_B$ represents an alkylene group having 1 to 4 carbon atoms; $R_{13}$ represents a hydrogen atom, an alkyl group having 1 to 12 carbon atoms, or an aryl group having 6 to 12 carbon atoms; m represents an integer of 4 to 100; and * represents a binding position, in Formula (E), $Z_5$ represents a single bond or a divalent linking group; $A_3^-$ represents an anionic group; $R_{14}$, $R_{15}$, $R_{16}$, and $R_{17}$ each independently represent a hydrogen atom, an alkyl group having 1 to 12 carbon atoms, or an aryl group having 6 to 12 carbon atoms; and * represents a binding position, and in Formula (F), $Z_6$ represents a single bond or a divalent linking group; $A_4^-$ represents a monovalent anion; $R_{18}$, $R_{19}$, and $R_{20}$ each independently represent a hydrogen atom, an alkyl group having 1 to 12 carbon atoms or an aryl group having 6 to 12 carbon atoms; and * represents a binding position, in Formula (G), $Y_1$ represents a single bond or a divalent linking group; and * represents a binding position, and in Formula (H), $R_{21}$, $R_{22}$, $R_{23}$, and $R_{24}$ each independently represent a hydrogen atom or a substituent; $Y_2$ represents a single bond or a divalent linking group; and * represents a binding position.

2. The conductive film forming composition according to claim 1, wherein in Formula (2), $W_1$ is a group represented by Formula (I), a group represented by Formula (J), a group represented by Formula (K), or a group represented by Formula (L), (I)

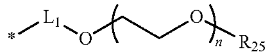

(J)

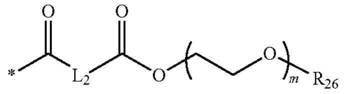

(K)

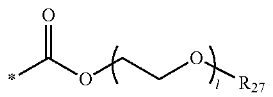

(L)

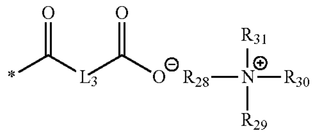

in Formula (I), $L_1$ represents an alkylene group having 1 to 12 carbon atoms or an arylene group having 6 to 12 carbon atoms; $R_{25}$ represents an alkyl group having 1 to 12 carbon atoms or an aryl group having 6 to 12 carbon atoms; n represents an integer of 4 to 100; and * represents a binding position, in Formula (J), $L_2$ represents an alkylene group having 1 to 12 carbon atoms or an arylene group having 6 to 12 carbon atoms; $R_{26}$ represents an alkyl group having 1 to 12 carbon atoms or an aryl group having 6 to 12 carbon atoms; m represents an integer of 4 to 100; and * represents a binding position, in Formula (K), $R_{27}$ represents an alkyl group having 1 to 12 carbon atoms or an aryl group having 6 to 12 carbon atoms; 1 represents an integer of 4 to 100; and * represents a binding position, and in Formula (L), $L_3$ represents an alkylene group having 1 to 12 carbon atoms or an arylene group having 6 to 12 carbon atoms; and $R_{28}$, $R_{29}$, $R_{30}$, and $R_{31}$ each independently represent a hydrogen atom, an alkyl group having 1 to 12 carbon atoms, or an aryl group having 6 to 12 carbon atoms; and * represents a binding position.

3. The conductive film forming composition according to claim 1, wherein in Formula (2), $W_2$ is a group represented by Formula (M), a group represented by Formula (N), a group represented by Formula (O), or a group represented by Formula (P), (M)

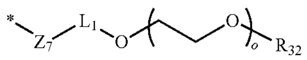

(N)

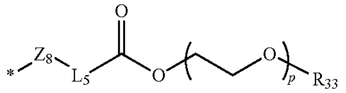

(O)

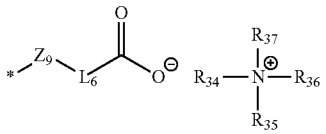

(P)

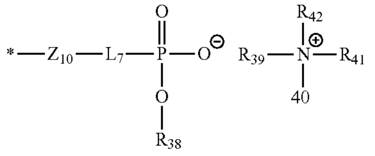

in Formula (M), $Z_7$ represents a single bond, a —COO— group, a —NHCO— group, or a —CONH— group; $L_4$ represents an alkylene group having 1 to 12 carbon atoms or an arylene group having 6 to 12 carbon atoms; $R_{32}$ represents an alkyl group having 1 to 12 carbon atoms or an aryl group having 6 to 12 carbon atoms; o represents an integer of 4 to 100; and * represents a binding position, in Formula (N), $Z_8$ represents a single bond, a —COO— group, a —NHCO— group, or a —CONH— group; $L_5$ represents an alkylene group having 1 to 12 carbon atoms or an arylene group having 6 to 12 carbon atoms; $R_{33}$ represents an alkyl group having 1 to 12 carbon atoms or an aryl group having 6 to 12 carbon atoms; p represents an integer of 4 to 100; and * represents a binding position, in Formula (O), $Z_9$ represents a single bond, a —COO— group, a —NHCO— group, or a —CONH— group; $L_6$ represents an alkylene group having 1 to 12 carbon atoms or an arylene group having 6 to 12 carbon atoms; $R_{34}$, $R_{35}$, $R_{36}$, and $R_{37}$ each independently represent a hydrogen atom, an alkyl group having 1 to 12 carbon atoms, or an aryl group having 6 to 12 carbon atoms; and * represents a binding position, and in Formula (P), $Z_{10}$ represents a single bond, a —COO— group, a —NHCO— group, or a —CONH— group; $L_7$ represents an alkylene group having 1 to 12 carbon atoms or an arylene group having 6 to 12 carbon atoms; $R_{38}$ represents a hydrogen atom or an alkyl group having 1 to 5 carbon atoms; $R_{39}$, $R_{40}$, $R_{41}$, and $R_{42}$ each independently represent a hydrogen atom, an alkyl group having 1 to 12 carbon atoms, or an aryl group having 6 to 12 carbon atoms; and * represents a binding position.

4. A conductive film forming composition comprising:

water;

conductive particles; and a migration inhibitor containing a compound represented by Formula (4), wherein an HLB value of the compound having a group represented by Formula (3) is 11 to 17, $$(Rx_A)_n\text{-}L\text{-}(Ry)_m \quad (4)$$

in Formula (4), L represents a single bond or an (n+m)-valent linking group; in a case where L is a single bond, n=1, and m=1; and in a case where L is an (n+m)-valent linking group, n and m are an integer and satisfy 1≤n≤6, 0≤m≤5, and 2≤n+m≤6, in Formula (4), $Rx_A$ is a group represented by the following Formula (GA); and in a case where n is equal to or greater than 2, a plurality of $Rx_A$'s may be the same as or different from each other, in Formula (4), Ry is a hydrogen atom, a substituent, or a group represented by the following Formula (H); and in a case where m is equal to or greater than 2, a plurality or Ry's may be the same as or different from each other, (GA)

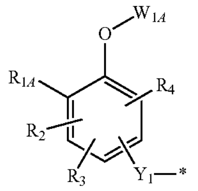

(H)

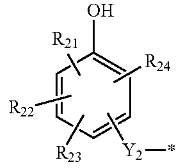

in Formula (4), $W_{1A}$ represents a group represented by Formula (1A); $R_{1a}$ represents an alkyl group having 1 to 22 carbon atoms; $R_2$, $R_3$, and $R_4$ each independently represent any one of a hydrogen atom, a substituent, and $W_2$; $W_2$ represents a group represented by Formula (D), a group represented by Formula (E), or a group represented by Formula (F); and * represents a binding position, (1A)

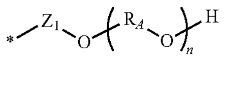

in Formula (1A), $Z_1$ represents a divalent linking group; $R_A$ represents an alkylene group having 1 to 4 carbon atoms; n represents an integer of 4 to 100; and * represents a binding position, (D)

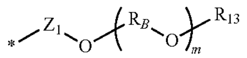

(E)

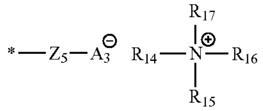

(F)

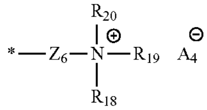

in Formula (D), $Z_4$ represents a single bond or a divalent linking group; $R_B$ represents an alkylene group having 1 to 4 carbon atoms; $R_{13}$ represents a hydrogen atom, an alkyl group having 1 to 12 carbon atoms, or an aryl group having 6 to 12 carbon atoms; m represents an integer of 4 to 100; and * represents a binding position, in Formula (E), $Z_5$ represents a single bond or a divalent linking group; $A_3^-$ represents an anionic group; $R_{14}$, $R_{15}$, $R_{16}$, and $R_{17}$ each independently represent a hydrogen atom, an alkyl group having 1 to 12 carbon atoms, or an aryl group having 6 to 12 carbon atoms; and * represents a binding position, and in Formula (F), $Z_6$ represents a single bond or a divalent linking group; $A_4^-$ represents a monovalent anion; $R_{18}$, $R_{19}$, and $R_{20}$ each independently represent a hydrogen atom, an alkyl group having 1 to 12 carbon atoms or an aryl group having 6 to 12 carbon atoms; and * represents a binding position, in Formula (GA), $Y_1$ represents; $Y_1$ represents a single bond or a divalent linking group; and * represents a binding position, and in Formula (H), $R_{21}$, $R_{22}$, $R_{23}$, and $R_{24}$ each independently represent a hydrogen atom or a substituent; $Y_2$ represents a single bond or a divalent linking group; and * represents a binding position.

5. The conductive film forming composition according to claim 4, wherein in Formula (4), $W_{1A}$ is a group represented by Formula (IA), a group represented by Formula (JA), or a group represented by Formula (KA), (IA)

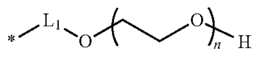

(JA)

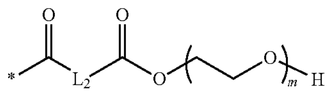

(KA)

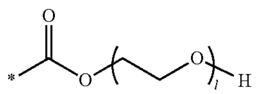

in Formula (IA), $L_1$ represents an alkylene group having 1 to 12 carbon atoms or an arylene group having 6 to 12 carbon atoms; n represents an integer of 4 to 100; and * represents a binding position, in Formula (JA), $L_2$ represents an alkylene group having 1 to 12 carbon atoms or an arylene group having 6 to 12 carbon atoms; m represents an integer of 4 to 100; and * represents a binding position, and in Formula (KA), 1 represents an integer of 4 to 100; and * represents a binding position.

6. The conductive film forming composition according to claim 4, wherein in Formula (4), $W_2$ is a group represented by Formula (M), a group represented by Formula (N), a group represented by Formula (O), or a group represented by Formula (P), (M)

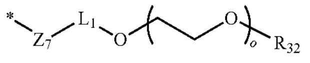

(N)

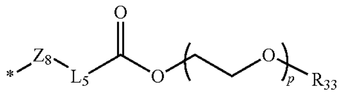

(O)

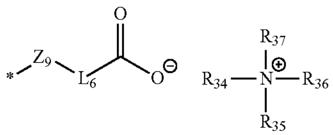

(P)

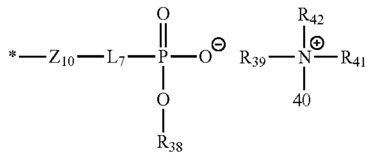

in Formula (M), $Z_7$ represents a single bond, a —COO— group, a —NHCO— group, or a —CONH— group; $L_4$ represents an alkylene group having 1 to 12 carbon atoms or an arylene group having 6 to 12 carbon atoms; $R_{32}$ represents an alkyl group having 1 to 12 carbon atoms or an aryl group having 6 to 12 carbon atoms; o represents an integer of 4 to 100; and * represents a binding position, in Formula (N), $Z_8$ represents a single bond, a —COO— group, a —NHCO— group, or a —CONH— group; $L_5$ represents an alkylene group having 1 to 12 carbon atoms or an arylene group having 6 to 12 carbon atoms; $R_{33}$ represents an alkyl group having 1 to 12 carbon atoms or an aryl group having 6 to 12 carbon atoms; p represents an integer of 4 to 100; and * represents a binding position, in Formula (O), $Z_9$ represents a single bond, a —COO— group, a —NHCO— group, or a —CONH— group; $L_6$ represents an alkylene group having 1 to 12 carbon atoms or an arylene group having 6 to 12 carbon atoms; $R_{34}$, $R_{35}$, $R_{36}$, and $R_{37}$ each independently represent a hydrogen atom, an alkyl group having 1 to 12 carbon atoms, or an aryl group having 6 to 12 carbon atoms; and * represents a binding position, and in Formula (P), $Z_{10}$ represents a single bond, a —COO— group, a —NHCO— group, or a —CONH— group; $L_7$ represents an alkylene group having 1 to 12 carbon atoms or an arylene group having 6 to 12 carbon atoms; $R_{38}$ represents a hydrogen atom or an alkyl group having 1 to 5 carbon atoms; $R_{39}$, $R_{40}$, $R_{41}$, and $R_{42}$ each independently represent a hydrogen atom, an alkyl group having 1 to 12 carbon atoms, or an aryl group having 6 to 12 carbon atoms; and * represents a binding position.

7. The conductive film forming composition according to claim 1, wherein an average particle size of the conductive particles is equal to or greater than 5 nm and equal to or less than 200 nm.

8. The conductive film forming composition according to claim 1, wherein the conductive particles contain a metal atom selected from the group consisting of Ag, Cu, Al, Ni, and Ta.

9. The conductive film forming composition according to claim 1, wherein a content of water is equal to or greater than 10% by mass with respect to a total mass of the conductive film forming composition.

10. A conductive film formed using the conductive film forming composition according to claim 1.

11. An organic thin film transistor comprising:

an electrode formed using the conductive film forming composition according to claim 1.

12. Electronic paper comprising:

the organic thin film transistor according to claim 11.

13. A display device comprising:

the organic thin film transistor according to claim 11.

14. A wiring board comprising:

wiring formed using the conductive film forming composition according to claim 1.

15. The conductive film forming composition according to claim 4, wherein an average particle size of the conductive particles is equal to or greater than 5 nm and equal to or less than 200 nm.

16. The conductive film forming composition according to claim 4, wherein the conductive particles contain a metal atom selected from the group consisting of Ag, Cu, Al, Ni, and Ta.

17. The conductive film forming composition according to claim 4, wherein a content of water is equal to or greater than 10% by mass with respect to a total mass of the conductive film forming composition.

18. A conductive film formed using the conductive film forming composition according to claim 4.

* * * * *